(12) United States Patent
Jacobsson

(10) Patent No.: US 10,694,646 B2
(45) Date of Patent: Jun. 23, 2020

(54) SMART CONTAINERS AND/OR BOXES HANDLED BY, AND STORED IN, AUTOMATED SMD WAREHOUSE

(71) Applicant: Mycronic AB, Taby (SE)

(72) Inventor: Nils Jacobsson, Taby (SE)

(73) Assignee: Mycronic AB, Taby (SE)

( * ) Notice: Subject to any disclaimer, the term of this patent is extended or adjusted under 35 U.S.C. 154(b) by 31 days.

(21) Appl. No.: 15/577,504

(22) PCT Filed: May 25, 2016

(86) PCT No.: PCT/EP2016/061848
§ 371 (c)(1),
(2) Date: Nov. 28, 2017

(87) PCT Pub. No.: WO2016/189059
PCT Pub. Date: Dec. 1, 2016

(65) Prior Publication Data
US 2019/0223334 A1    Jul. 18, 2019

Related U.S. Application Data

(60) Provisional application No. 62/167,585, filed on May 28, 2015.

(51) Int. Cl.
*G06Q 30/00* (2012.01)
*H05K 13/02* (2006.01)
(Continued)

(52) U.S. Cl.
CPC ......... *H05K 13/021* (2013.01); *B65G 1/1375* (2013.01); *H05K 5/0017* (2013.01);
(Continued)

(58) Field of Classification Search
CPC ....... G06Q 10/087; G06Q 10/08; G06Q 10/06
(Continued)

(56) References Cited

U.S. PATENT DOCUMENTS 4,782,958 A * 11/1988 Price .................. G11B 23/0236
                                                            211/41.12
4,783,740 A    11/1988 Ishizawa et al.
(Continued)

FOREIGN PATENT DOCUMENTS

CN          104272891 A       1/2015
DE       102006022371 A1      11/2007
(Continued)

OTHER PUBLICATIONS

International Search Report PCT/ISA/210 for International Application No. PCT/EP2016/061848 dated Dec. 12, 2016.
(Continued)

*Primary Examiner* — Ahshik Kim
(74) *Attorney, Agent, or Firm* — Harness, Dickey & Pierce, P.L.C.

(57) ABSTRACT

A container, or box, for use in a Surface Mount Technology (SMT) system includes an outer shell and at least one compartment. The outer shell has side walls and a base. The container is configured to store a plurality of SMT-job related objects in said at least one compartment where one of said SMT-job related objects is not a component tape reel, wherein said container has a logically and electronically unique identity in the SMT system represented by a barcode or RFID tag arranged on the container, said unique ID of the container being configured to be associated with each of the unique IDs of said plurality of SMT-job related objects stored in said at least one compartment.

20 Claims, 27 Drawing Sheets

(51) Int. Cl.
| | |
|---|---|
| *H05K 13/00* | (2006.01) |
| *H05K 13/08* | (2006.01) |
| *B65G 1/137* | (2006.01) |
| *H05K 5/00* | (2006.01) |
| *H05K 13/04* | (2006.01) |
| *G06K 7/10* | (2006.01) |
| *G06K 7/14* | (2006.01) |

(52) U.S. Cl.
CPC ....... *H05K 13/0084* (2013.01); *H05K 13/086* (2018.08); *G06K 7/10297* (2013.01); *G06K 7/1413* (2013.01); *H05K 13/0419* (2018.08)

(58) Field of Classification Search
USPC .......................................................... 235/385
See application file for complete search history.

(56) References Cited

U.S. PATENT DOCUMENTS

| | | | | |
|---|---|---|---|---|
| 7,243,047 | B2* | 7/2007 | Chang | G05B 19/41875 700/110 |
| 9,836,042 | B2* | 12/2017 | Maenishi | G05B 19/418 |
| 2005/0178811 | A1* | 8/2005 | Rodgers | H05K 13/0417 226/1 |
| 2016/0205819 | A1* | 7/2016 | Jacobsson | H05K 13/021 700/112 |
| 2018/0020845 | A1* | 1/2018 | Khoshnood | G06Q 10/08 211/59.2 |

FOREIGN PATENT DOCUMENTS

| | | |
|---|---|---|
| EP | 0453370 A1 | 10/1991 |
| EP | 1715733 A2 | 10/2006 |
| EP | 2792619 A1 | 10/2014 |
| WO | WO-2013/135730 A1 | 9/2013 |
| WO | WO-2015/040085 A1 | 3/2015 |

OTHER PUBLICATIONS

Written Opinion of the International Searching Authority PCT/Isa/237 for International Application No. PCT/EP2016/061848 dated Dec. 12, 2016.

Chinese Office Action dated Sep. 25, 2019 for corresponding Chinese Application No. 201680042845.4.

* cited by examiner

| 8mm Agilis 4.7 Yellow |
| --- |
| 8MM 060 |

| 8mm Agilis 4.7 Yellow |
| --- |
| 8MM 060 |

| Move Container |
| --- |
| Scan new Location |

SMART CONTAINERS AND/OR BOXES HANDLED BY, AND STORED IN, AUTOMATED SMD WAREHOUSE

CROSS-REFERENCE TO RELATED APPLICATIONS

This application is a national phase under 35 U.S.C. § 371 of PCT International Application No. PCT/EP2016/061848 which has an International filing date of May 25, 2016, which claims priority to U.S. Provisional Application No. 62/167,585, filed May 28, 2015, the entire contents of each of which are hereby incorporated by reference.

BACKGROUND

Field

Example embodiments relate to handling of components in a Surface Mount Technology (SMT) system, and/or receiving and providing of information related to a SMT job.

Description of Related Art

Surface Mount Technology (SMT) is becoming a more preferable method of automated production of electronic printed circuit boards (PCBs). Machines for pick-and-place mounting of components on a substrate, such as a PCB, or a substrate for a System in Package (SiP) component are subject to different, often contradictory, demands such as mounting speed, mounting precision, size, prize, etc. The expression "pick and place" describes the very mounting operation in which a mounting head is moved to a component feeder area, where the mounting head picks up one or more components from one or more of the component feeders, and then is moved to a mounting area where the mounting head places the component or components on the substrate.

Supplies of a certain type of component (e.g., a certain specified type of capacitor, resistor, diode, integrated circuit (IC), etc.) are supplied on trays carrying a type of component, on sticks, or on tapes in reels with a series of pockets of appropriate depth in the tape.

SUMMARY

One or more example embodiments relate to improved handling of components in a Surface Mount Technology (SMT) system.

One or more example embodiments provide more efficient and/or less error-prone methods, systems and/or devices for handling changeovers and/or replenishment work associated with a SMT job.

One or more example embodiments relate to methods, systems and/or devices for changing information related to a SMT job on a display.

Example embodiments relate to handling of components in a Surface Mount Technology (SMT) system, and/or receiving and providing of information related to a SMT job. In particular, the technology disclosed relates to a display (e.g., an alphanumerical display) associated with a carrier for carrying component tapes held by a component tape reel and the sending of instructions related to an SMT job as well as the changing of display data related to an SMT job. One or more example embodiments also relate to smart containers/boxes for being handled by, and stored in, an automated SMD Warehouse At least one example embodiment provides a container, or box, for use in an Surface Mount Technology (SMT) system comprising an SMT database and an automatic Surface Mount Device (SMD) warehouse, the container comprising: an outer shell having side walls and a base; and at least one compartment within the container, wherein the container is configured to store a plurality of SMT-job related objects in said at least one compartment where one of said SMT-job related objects is not a component tape reel, wherein said container has a logically and electronically unique identity in the SMT system represented by a barcode or RFID tag arranged on the container, said unique ID of the container being configured to be associated with each of the unique IDs of said plurality of SMT-job related objects stored in said at least one compartment.

The barcode or RFID tag arranged on the container may be configured to be linked in the SMT database to the each of the unique IDs of said plurality of SMT-job related objects stored in said at least one compartment by the at least one of the actions of scanning barcodes and/or reading RFID tags in sequence using a barcode scanner or RFID tag reader.

Said container may comprise a display unit, or electronic label, arranged on the container, said display unit being configured to display information about a plurality of SMT-job related objects stored in the compartments of said container.

Said display unit, or electronic label, may be configured to display data in form of a plurality of electronic barcodes representing the SMT-job related objects stored in the container.

Said display unit, or electronic label, may be configured to display SMT-job related information for each one of a plurality of compartments of the container, wherein said display is further configured to continuously update the SMT-job related information associated with each one of the plurality of compartments.

The outer shell may have the same or substantially the same dimensions as a component tape reel.

The container may further include a barcode fixed to the outer shell, the barcode being associated with at least one of SMT-job-related information and location information for the container. The barcode may be an electronic barcode.

The container may further include a radio-frequency identifier (RFID) fixed to the outer shell, the RFID being associated with at least one of SMT job-related information and location information for the container.

The container may further include a barcode fixed in the at least one compartment, the barcode being associated with at least one of SMT-job-related information and location information for the container.

The container may further include a radio-frequency identifier (RFID) fixed in the at least one compartment, the RFID being associated with at least one of SMT job-related information and location information for the container.

The container may further include an e-label fixed to the outer shell, the e-label being associated with at least one of SMT job-related information and location information for the container.

The at least one compartment may be configured to store a plurality of at least one of the following types of SMT-job related objects: components in plastic bags; components without a component reel; tools; fixtures; JEDEC trays; printed circuit boards; and board supports. At least one example embodiment provides a container, or box, for use in a Surface Mount Technology (SMT) system comprising an SMT database and an automatic Surface Mount Device (SMD) warehouse, the container comprising: an outer shell having side walls and a base; and at least one compartment within the container, wherein the container is configured to store at least one SMT-job related object, wherein said container has a logically and electronically unique identity in the SMT system, said unique ID of the container being configured to be associated with each of the unique IDs of said at least one SMT-job related objects stored in said at least one compartment.

At least one example embodiment provides a container, or box, for use in a Surface Mount Technology (SMT) system comprising an SMT database and an automatic Surface Mount Device (SMD) warehouse, the container comprising: an outer shell having side walls and a base; and at least one compartment within the container, wherein the container is configured to store a plurality of SMT-job related objects in said at least one compartment where one of said SMT-job related objects is not a component tape reel, wherein said container has a logically and electronically unique identity in the SMT system, said unique ID of the container being configured to be associated with each of the unique IDs of said plurality of SMT-job related objects stored in said at least one compartment.

At least one example embodiment provides a container, or box, for use in a Surface Mount Technology (SMT) system comprising an SMT database and an automatic Surface Mount Device (SMD) warehouse, the container comprising: an outer shell having side walls and a base; and at least one compartment within the container, wherein the container is configured to store at least one SMT-job related object, wherein said container has a logically and electronically unique identity in the SMT system, said unique ID of the container being configured to be associated with each of the unique IDs of said at least one SMT-job related objects stored in said at least one compartment, wherein said unique ID of the container and/or each of said unique IDs of said at least one compartment is configured to be logically associated with a discrete storage location or position within the SMT system.

At least one example embodiment provides a container, or box, for use in a Surface Mount Technology (SMT) system comprising an SMT database and an automatic Surface Mount Device (SMD) warehouse, the container comprising: an outer shell having side walls and a base; and at least one compartment within the container, wherein the container is configured to store at least one SMT-job related object, wherein said container has a logically and electronically unique identity in the SMT system, said unique ID of the container being configured to be associated with each of the unique IDs of said at least one SMT-job related objects stored in said at least one compartment, wherein said unique ID of the container and/or each of said unique IDs of said at least one compartment is configured to be logically associated with a discrete storage location or position within an automated SMD warehouse of the SMT system, said automated SMD warehouse comprising an actuator such as a robot configured to handle bin load units such as component tape reels.

At least one example embodiment provides a container, or box, for use in a Surface Mount Technology (SMT) system comprising an SMT database and an automatic Surface Mount Device (SMD) warehouse, the container comprising: an outer shell having side walls and a base; and at least one compartment within the container, wherein the container is configured to store at least one SMT-job related object, wherein said container has a logically and electronically unique identity in the SMT system, said unique ID of the container being configured to be associated with each of the unique IDs of said at least one SMT-job related objects stored in said at least one compartment, wherein said unique ID of the container and/or each of said unique IDs of said at least one compartment is configured to be logically associated with a discrete storage location or position within an automated SMD warehouse of the SMT system, said automated SMD warehouse comprising an actuator such as a robot configured to handle bin load units such as component tape reels, the outer shell having a component tape-reel shape such that the container is capable of being handled by an actuator of the automatic SMD warehouse, thereby providing for the actuator of an SMD warehouse to handle both component tape reels and the container in order to store and retrieve them from the SMD warehouse.

At least one example embodiment provides a container, or box, for use in a Surface Mount Technology (SMT) system comprising an SMT database and an automatic Surface Mount Device (SMD) warehouse, the container comprising an outer shell having side walls and a base; and at least one compartment within the container, wherein the container is configured to store a plurality of SMT-job related objects in said at least one compartment where one of said SMT-job related objects is not a component tape reel, wherein said container has a logically and electronically unique identity in the SMT system, wherein said unique identity of the container may for example be represented by a barcode or RFID tag arranged on the container, said unique ID of the container being configured to be associated with each of the unique IDs of said plurality of SMT-job related objects stored in said at least one compartment.

At least one example embodiment provides a container, or box, for use in a Surface Mount Technology (SMT) system comprising an SMT database and an automatic Surface Mount Device (SMD) warehouse, the container comprising: an outer shell having side walls and a base; and at least one compartment within the container, wherein the container is configured to store a plurality of SMT-job related objects in said at least one compartment where one of said SMT-job related objects is not a component tape reel, wherein said container has a logically and electronically unique identity in the SMT system represented by a barcode or RFID tag arranged on the container, said unique ID of the container being configured to be associated with each of the unique IDs of said plurality of SMT-job related objects stored in said at least one compartment.

At least one other example embodiment provides a container, or box, for use in an Surface Mount Technology (SMT) system comprising an SMT database and an automatic Surface Mount Device (SMD) warehouse, the container comprising: an outer shell having side walls and a base; and at least one compartment within the container, wherein the container is configured to store a plurality of SMT-job related objects, e.g. plastic bags containing components, in said at least one compartment where one of said SMT-job related objects is not a component tape reel, and wherein said container comprises a display, or electronic label, arranged on the container, said display being configured to display information about said plurality of SMT-job related objects stored in the compartments of said container.

Any of the above given example embodiments of a container may further include: an outer shell having side walls and a base; and at least one compartment within the container, the outer shell having a component tape-reel shape such that the container is capable of being handled by an actuator of the automatic SMD warehouse, thereby providing for the actuator of an SMD warehouse to handle both component tape reels and the container in order to store and retrieve them from the SMD warehouse.

At least one other example embodiment provides any of the above given example embodiments of a container, wherein the container is further configured to store a plurality of SMT-job related objects in said at least one compartment, and wherein the readable identity tag is configured to be linked in the SMT database to the each of the unique IDs of said plurality of SMT-job related objects.

At least one other example embodiment provides any of the above given example embodiments of a container, wherein the container is further configured to store a plurality of SMT-job related objects in said at least one compartment, and wherein the readable identity tag is a barcode or RFID tag which is arranged on the container and is configured to be linked in the SMT database to the each of the unique IDs of said plurality of SMT-job related objects stored in said at least one compartment by the at least one of the actions of scanning barcodes and/or reading RFID tags in sequence using a barcode scanner or RFID tag reader.

At least one other example embodiment provides any of the above given example embodiments of a container, wherein each of a plurality of compartments of the container is further configured with a unique identity representing a storage position for one SMT-job related object.

At least one other example embodiment provides any of the above given example embodiments of a container, wherein each of a plurality of compartments of the container is further configured with a unique identity representing a storage position for one SMT-job related object, and wherein the readable identity tag is configured to be linked in the SMT database to the each of the unique IDs of said plurality of SMT-job related objects.

At least one other example embodiment provides any of the above given example embodiments of a container, wherein each of a plurality of compartments of the container is further configured with a unique identity in form of a readable barcode or RFID tag configured to represent a storage location or position for one SMT-job related object, and wherein the readable identity tag is configured to be linked in the SMT database to the each of the unique IDs of said plurality of SMT-job related objects. The unique identity of each of the at least one compartment may be in the form of a unique and readable barcode or RFID tag which is configured to represent a discrete and unique storage location or position within the SMT system such as a discrete storage position on a storage shelf or within an automated SMD warehouse.

At least one other example embodiment provides any of the above given example embodiments of a container, wherein each of a plurality of compartments of the container is further configured with a unique identity in form of a readable barcode or RFID tag configured to be associated with a storage location or position for one SMT-job related object, and wherein the readable identity tag is configured to be linked in the SMT database to the each of the unique IDs of said plurality of SMT-job related objects. The unique identity of each of the at least one compartment may be in the form of a unique and readable barcode or RFID tag which is configured to be associated with (linked to by reading barcodes/RFID tags) a discrete and unique storage location or position within the SMT system such as a discrete storage position on a storage shelf or within an automated SMD warehouse.

At least one other example embodiment provides any of the above given example embodiments of a container, wherein each of a plurality of compartments of the container is further configured with a unique identity in form of a readable identity tag, and wherein each of said readable identity tags is configured to be associated with and/or represent a storage location or position within a SMD warehouse when the container is stored in the SMD warehouse, and wherein each of the readable identity tags of the compartments of the container is configured to be linked in the SMT database to the each of the unique IDs of said plurality of SMT-job related objects.

At least one other example embodiment provides surface mount technology (SMT) system, comprising: an automated surface mount device (SMD) warehouse configured to store component tape reels and containers, at least one of the containers including an outer shell having side walls and a base, and at least one compartment within the container being configured for storing a plurality of plastics bags with components, the outer shell having a component tape-reel shape such that the container is capable of being handled by an actuator of the automatic SMD warehouse, thereby providing for the actuator of an SMD warehouse to handle both component tape reels and the container.

At least one other example embodiment provides a method for storing surface mount technology (SMT) components, the method comprising: storing, by an actuator, SMT components in containers at positions within an automated SMD warehouse, at least one of the containers including an outer shell having side walls and a base, and at least one compartment within the container, the outer shell having a component tape-reel shape.

At least one other example embodiment provides a method for changing operator information in a Surface Mount Technology (SMT) system comprising an SMT information database and a SMT pick and place machine, the method comprising: providing a container, wherein said container is associated with, or comprises, a display unit/electronic label; receiving, via a network, input data related to said container and one of an ongoing and upcoming SMT job; and presenting display data on said display unit/electronic label based on said received input data, wherein said display data is representing a plurality of SMT-job related objects stored in the at least one compartment of said container.

Said input data may be wirelessly received via a radio-based or light-based communications network, the communications network is communicatively connected to the SMT information database but is a separate network from the network providing the SMT pick and place machine with information from the SMT information database.

Said input data may be related to one of an ongoing and upcoming SMT job and triggered by an event related to said SMT job, and/or may be retrieved from said SMT information database in response to a request sent by the operator, said input data being associated with a certain changeover process, replenishment work or kitting work.

Said at least one input device (e.g., one or more pressure-sensitive buttons) may be associated with, attached to, located on or comprised in said container.

Said at least one input device (e.g., pressure-sensitive buttons) may be part of said display unit/electronic label, and further configured to respond to external pressure applied to the display surface in order to change display data of said display unit/electronic label.

Said container may have an identity tag in the form of a barcode attached to the container's surface.

Said container may have an electronic identity tag in the form of an electronic barcode constituting at least a portion of the electronic data displayed on said display unit/electronic label.

Said display unit/electronic label may be attached to the surface of the container.

At least one of said identity tag in the form of an electronic barcode and said display may be configured to be at least one of logically and electronically connected with each other.

At least one of said identity tag in the form of an electronic barcode and said display unit is configured with means for enabling one-way or two-way wireless communication with at least one of a radio-based and/or light-based communications network.

At least one other example embodiment provides a method for providing SMT job related information to a SMT information database in a Surface Mount Technology (SMT) system comprising a SMT pick and place machine, the method comprising: providing a container, wherein said container is associated with or comprises a display; receiving input data related to said container and an ongoing or upcoming SMT job via a network; presenting display data on said display based on said received input data; and activating or pushing at least one input device, such as one or more pressure-sensitive buttons or a non-contact activated input device, associated with and/or located on said display, to trigger the control unit of the display or electronic label to at least one of 1) changing the content of the display data on said display or electronic label, and 2) automatic sending of status-related data from said display or electronic label.

The container may be configured with a plurality of compartments, each compartment being configured to store at least one of the following types of SMT-job related objects: components in plastic bags; components without a component reel; tools; JEDEC trays; and fixtures.

The container may be configured with a removable insert for providing storage sections in form of a plurality of compartments, wherein, when the insert is removed, the container is configured to store only one SMT-job related object in form of a bin load unit, component tape reel, printed circuit board or JEDEC tray.

BRIEF DESCRIPTION OF DRAWINGS

Example embodiments will be described in more detail with regard to the attached drawings, in which.

DETAILED DESCRIPTION

Figure 1:
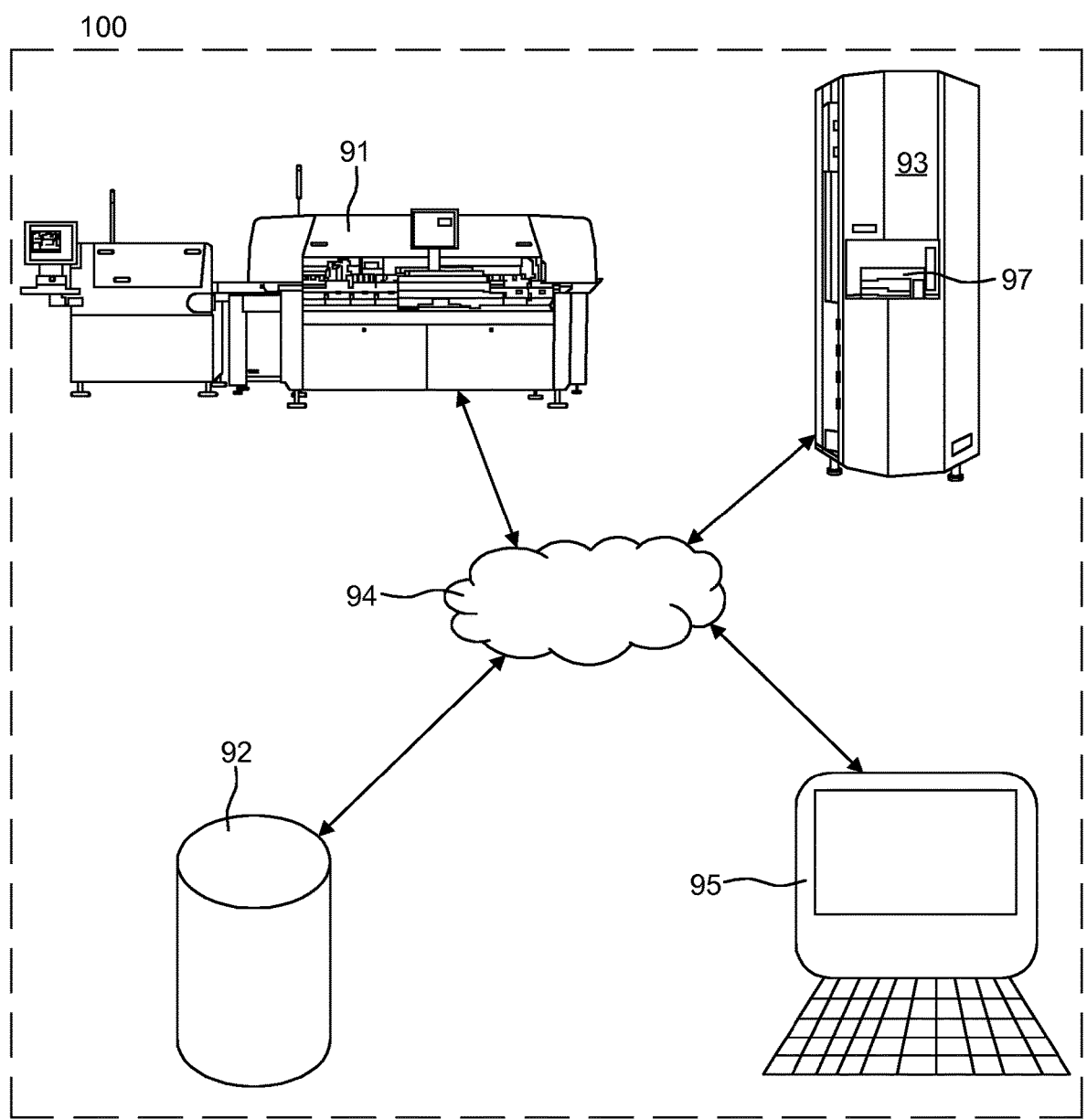
FIG. 1 shows schematically an example embodiment of a system for Surface Mount Technology (SMT) semi-automated mounting of electronic components on printed circuit boards.

One or more example embodiments will be described in detail with reference to the accompanying drawings.

Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices (e.g., control units, display controller units, etc.) according to one or more example embodiments may be implemented using hardware, software, and/or a combination thereof. For example, hardware devices, such as the processor 210, may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., the processor 210, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

A communications network (e.g., communications network 94 in FIG. 1) may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX), optical communication, infrared communication and ultrasonic communication, etc. However, example embodiments are not limited to these examples.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least some example embodiments provide use of a container, box and/or tray box (hereinafter referred to as a container) suitable for being handled in an automatic manner (e.g., by the actuator/robot of an automatic Surface Mount Device (SMD) warehouse discussed herein). The container may be configured to have the same or substantially the same geometry and/or dimensions as a "normal" tray and/or component tape reel, such that the container may be fetched by the actuator/robot. Accordingly, the container may, in some cases, be said to simulate a component tape reel.

A container (also referred to as a box) refers to a box or tray box with at least one compartment configured to carry/store at least one of components without a component reel (e.g., components in plastic bags, tools, fixtures, printed circuit boards, board support, etc.). According to at least some example embodiments, the container may comprise a display and/or a display controller unit. The display controller unit may optionally recognize and register components placed in the container (e.g., by scanning barcodes or RFID tags attached to the containers). The scanning may be performed manually by a handheld barcode tag/RFID tag scanner or by a barcode tag/RFID tag scanner integrated in a SMD warehouse. Alternatively the display controller unit is configured to communicate data (e.g., identities of recognize and register containers) via a communications network to the SMT information database (e.g., such that information on the content of the container is available in the SMT information database). Alternatively, the container is provided with a plurality of separate compartments, sections or cells adapted to each at least one of components without a component reel (e.g. components in plastic bags, tools, fixtures, printed circuit boards or board support), and wherein the display controller is configured to receive data via the communications network from the SMT information database. The container may be provided with a number of separate positions for storing components without a component reel (e.g. components in plastic bags, tools, fixtures, printed circuit boards and board support). In at least one example embodiment, these positions are defined by separate compartments, or sections or cells, one for each component, the compartments being separated by intermediate walls, or the like. Thus, set of components without a component reel (e.g. components in plastic bags, tools, fixtures, printed circuit boards or board support) is effectively kept in place and the component holders carried by the same carrier will not interfere with one another.

One or more example embodiments relate to methods, systems and/or arrangements configured to handle component tapes in connection with mounting components onto circuit boards in a component mounting machine, which utilizes a container or box having an outer shell and at least one compartment. The outer shell has side walls and a base. The container or box is configured to store a plurality of SMT-job related objects in said at least one compartment where one of said SMT-job related objects is not a component tape reel, wherein said container has a logically and electronically unique identity in the SMT system represented by a barcode or radio-frequency identification (RFID) tag arranged on the container, said unique ID of the container being configured to be associated with each of the unique IDs of said plurality of SMT-related objects stored in said at least one compartment.

One or more example embodiments provide a container, or box, for use in an SMT system including an SMT database and an automatic SMD warehouse, the container comprising: an outer shell having side walls and a base; and at least one compartment within the container, wherein the container is configured to store a plurality of SMT-job related objects, e.g. plastic bags containing components, in said at least one compartment where one of said SMT-job related objects is not a component tape reel, and wherein said container comprises a display, or electronic label, arranged on the container, said display being configured to display information about said plurality of SMT-job related objects stored in the compartments of said container.

One or more example embodiments provide a SMT system, comprising: an automated SMD warehouse configured to store component tape reels and containers, at least one of the containers including an outer shell having side walls and a base, and at least one compartment within the container being configured for storing a plurality of plastics bags with components, the outer shell having a component tape-reel shape such that the container is capable of being handled by an actuator of the automatic SMD warehouse, thereby providing for the actuator of an SMD warehouse to handle both component tape reels and the container.

One or more example embodiments provides a method for storing SMT components, the method comprising: storing, by an actuator, SMT components in containers at positions within an automated SMD warehouse, at least one of the containers including an outer shell having side walls and a base, and at least one compartment within the container, the outer shell having a component tape-reel shape.

One or more example embodiments provide a method for changing operator information in a SMT system comprising an SMT information database and a SMT pick and place machine, the method comprising: providing a container, wherein said container is associated with, or comprises, a display unit/electronic label; receiving, via a network, input data related to said container and one of an ongoing and upcoming SMT job; and presenting display data on said display unit/electronic label based on said received input data, wherein said display data is representing a plurality of SMT-job related objects stored in the at least one compartment of said container.

One or more example embodiments provides a method for providing SMT job related information to a SMT information database in a SMT system including a SMT pick and place machine, the method comprising: providing a container, wherein said container is associated with or comprises a display; receiving input data related to said container and an ongoing or upcoming SMT job via a network; presenting display data on said display based on said received input data; and activating or pushing at least one input device, such as one or more pressure-sensitive buttons or a non-contact activated input device, associated with and/or located on said display, to trigger the control unit of the display or electronic label to at least one of 1) changing the content of the display data on said display or electronic label, and 2) automatic sending of status-related data from said display or electronic label.

FIG. 1 schematically illustrates an example embodiment of a SMT system 100.

Referring to FIG. 1, the SMT system 100 comprises a SMT information database 92, a SMT pick and place machine 91, an automated SMD warehouse 93, and optionally an SMT job planning computing device 95, wherein each of the nodes mentioned above are communicatively coupled in a communications network 94.

The automated SMD warehouse 93 will be discussed in more detail below with regard to FIG. 2.

The SMT information database 92 is a node configured to receive information data via an external communication interface, such as a communications network 94, to store said data in a memory, to receive a request for information, to retrieve data from memory based on said request and to send data via said external communication interface to a requesting node. Examples of information stored in the database are SMT component location on a substrate, the type of SMT component, the number of produced substrates with placed SMT components, SMT job identity (ID), IDs of component tape reels, containers, pallets and bins and/or association information (e.g., linking a component tape reel ID to a feeder ID, a container ID to a pallet ID, a container ID to a bin ID, etc.). The SMT information database 92 may be implemented as a relational or self-relational database, a dBASE database, an object oriented database, NewSQL database or NoSQL database such as an XML database, etc.

The SMT job planning computing device 95 may include a processor, a memory, a user input/output interface and a communication interface configured to receive user input as data, present data to said user, store data to memory, retrieve data from memory and send data to an external unit (e.g., the SMT information database 92). The SMT job planning computing device 95 may be configured and used to plan, improve and/or optimize one or more of upcoming SMT jobs (e.g., the order of upcoming SMT jobs), the order of loading of SMT feeders into the SMT pick and place machine 91, etc.

The SMT pick-and-place machine (also referred to as a SMT component placement system) 91 may include one or more robotic machines, which are used to place SMT components onto a substrate. The SMT components (e.g., carried by tapes wound up on component tape reels or by containers without component tape reels) are placed in given (or, alternatively, desired or predetermined) component feeding positions (e.g., magazines) in the pick and place machine 91.

In a SMT pick and place machine, the total task of placing all required components on a given (or, alternatively, desired or predetermined) number of substrates is referred to as producing an SMT job. A SMT job typically comprises SMT job data descriptive of all required components, the position of each component on a substrate required to produce SMT production units, such as electronic PCBs, and the planned relative order of the SMT job.

A typical workflow in a SMT system includes a user planning a SMT job to be executed, storing said SMT job in a SMT information database, a SMT operator (e.g., a human being or alternatively a robot) retrieving required components from said automated SMD warehouse, transferring required components (e.g., placed on component tape reels or in containers) to the pick and place machine and loading given (or, alternatively, desired or predetermined) component feeder positions at the pick and place machine (e.g., magazines or trolleys) of said SMT pick and place machine and start SMT production of SMT production units (e.g., substrates with SMT components placed thereupon).

Figure 2:
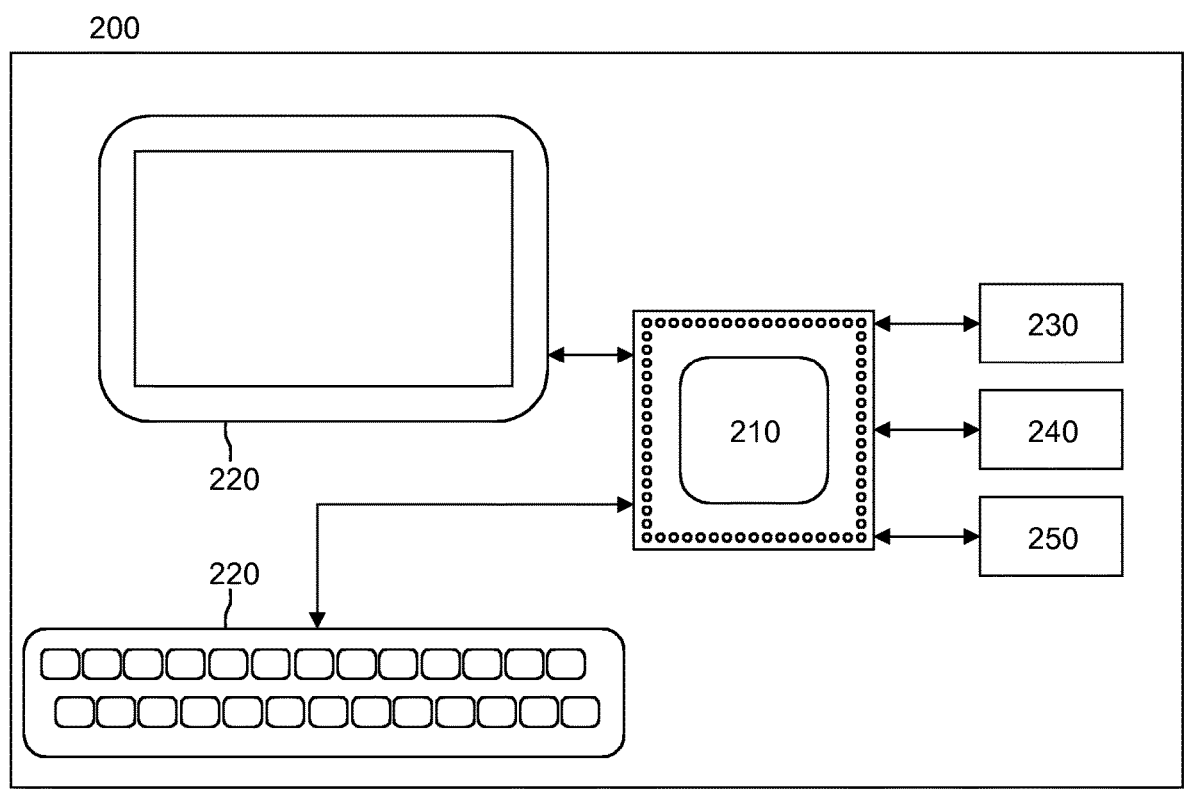
FIG. 2 shows an example embodiment of an automated surface mount device (SMD) warehouse device.

FIG. 2 shows a schematic view of an automated SMD warehouse 200 configured to obtain information related to upcoming SMT jobs, and store bins at given (or, alternatively, desired or predetermined) positions within said automated SMD warehouse 200.

Referring to FIG. 2, the automated SMD warehouse 200 is an automatic robotic storage unit including one or more memories 230, an external communication interface 240, a processor/processing unit 210, and an actuator 250. The automated SMD warehouse 200 may further include a user input/output device adapted to receive user indication data from the processing unit 210, and present the data to a user (e.g., by the use of indication means such as light emitting diodes (LEDs) or displays).

The processor/processing unit 210 is configured to execute computer-readable instructions such that the processing unit 210 is configured to perform functions according to one or more example embodiments. The automated SMD warehouse 200 further comprises at least one memory 230 configured to: store data values or parameters received from a processing unit 210; or retrieve and send data values or parameters to a processing unit 210.

The communications interface 240 is configured to send or receive data values or parameters to/from a processing unit 210 to/from external units via the communications interface 240.

The actuator 250 (e.g., a robot or robotic arm) is configured to retrieve/store bins, pallets, containers and/or component tape reels from given (or, alternatively, desired or predetermined) positions within the automated SMD warehouse based on control data received from the processing unit 210.

The processing unit 210 may be communicatively coupled and configured to communicate with the one or more memories 230. The one or more memories 230 may be configured to store data and parameters for use by the processing unit 210.

When producing SMT production units in an SMT system, a SMT job associated with an SMT production unit is planned or given (or, alternatively, desired or predefined) and stored in an SMT information database. Information relating to an SMT job may indicate the number of production units to be produced and component requirements to complete production of the SMT unit by a SMT pick and place machine.

After finishing a SMT job, the operator unloads the bin from the pick and place machine and returns the bin to the port of the automated SMD warehouse, which in turn receives the bin and stores the bin at an available position or storage position within the automated SMD warehouse using one or more actuators, such as a robot, robot arm or other actuator known to a skilled person.

One or more example embodiments provide a method comprising: storing, by an actuator, SMT components in containers at positions within an automated SMD warehouse, at least one of the containers including an outer shell having side walls and a base, and at least one compartment within the container, the outer shell having a component tape-reel shape.

Returning to FIG. 2, in at least one example, an operator provides a container comprising at least one of components without a component reel (e.g., components in plastic bags, tools, fixtures, printed circuit boards or board support) at the port of said automated SMD warehouse. The container is identified, for example, by scanning an identity tag or retrieving associated containers from the SMT information database. The processing unit 210 in the automated SMD warehouse 200 identifies an available position within said automated SMD warehouse 200 that may accommodate the container and retrieves the corresponding parameter value from memory 230. The actuator 250 then stores the received container at the retrieved position within said automated SMD warehouse 200 and stores the position within said automated SMD warehouse 200 associated with the container's ID in the memory 230 and/or the SMT information database 92 (FIG. 1). The container ID may also be, for example, associated with an upcoming SMT job.

When storing the container, the processing unit 210 may determine at least one of the container's ID or the IDs of at least one of the components (e.g., components in plastic bags, tools, fixtures, printed circuit boards or board support) contained in said container.

In one example, an ID tag of the container or the IDs associated with the components without a component tape reel (e.g., components in plastic bags, tools, fixtures, printed circuit boards or board support contained in said container) may be scanned with a scanner. The ID tags may be, for example, barcodes and/or RFID tags.

Individual ID tags attached to the container may be scanned; and the processing unit 210 may store an ID of each container in the memory 230 in said automated SMD warehouse 200.

Individual ID tags attached to the container and/or a plurality of ID tags each associated with a plurality of one of components without a component tape reel, such as components in plastic bags, tools, fixtures, printed circuit boards or board support contained in said container may be scanned; and the ID or IDs and the position or positions of the stored container(s) may be stored in at least one of the memory 230 and the SMT information database 92.

In one example, the scanning is performed at the input port of the automated SMD warehouse 200 with the ID tags attached to the container and/or by scanning a plurality of tags, each associated with a plurality of one of components without a component tape reel.

The actuator 250 may grip said container and/or components and move said container and/or components to an intermediate position within said automated SMD warehouse 200. The automated SMD warehouse may replace said components in the container at the intermediate position.

In one example, the actuator 250 moves the container into a position where the container can be scanned by a fixed ID tag scanner (e.g., a barcode scanner). Said individual ID tags may be barcodes adapted to be scanned by a barcode scanner unit and through said scanning provide information to the barcode scanner unit of an associated ID.

Individual ID tags attached to the container may be scanned to obtain IDs; and the IDs associated with certain components, tools, board support or boards may be retrieved from said SMT information database.

The ID tag attached to or associated with a container is one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, MaxiCode, mCode, MiniCode, MicroPDF417, MMCC, Nintendo e-Reader # Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode, WaterCode and Radio Frequency Identification (RFID) tags.

Still referring to FIG. 2, according to at least some example embodiments, said position associated with a container received by said SMD warehouse 200 is stored as a parameter representing a position within said automated SMD warehouse 200.

In one example, said position is an X, Y, Z coordinate or a shelf ID.

Still referring to FIG. 2, in the automated SMD warehouse 200, a retrieved bin may be loaded with a plurality of bin load units, and bin load units each comprise or constitute a container and/or component tape reel.

At least one other example embodiment provides a method for providing operator information in a SMT system comprising an SMT information database and a SMT pick and place machine where SMT production have been started, wherein started SMT production comprises at least feeding components from a bin load unit to the SMT pick and place machine, the method comprising: receiving a bin in said SMT pick and place machine, wherein said bin comprises an alphanumerical display controller unit and an alphanumerical display; receiving display data relating to an SMT job via a communications network; and presenting said display data on said alphanumerical display.

At least one other example embodiment provides a method for providing operator information in a SMT system comprising an SMT information database and a SMT pick and place machine, the method comprising: receiving a bin in said SMT pick and place machine, wherein said bin has a bin ID tag attached to the bins forward facing surface such that the surface is facing an operator, wherein said ID tag comprises an alphanumerical display controller unit and a alphanumerical display; starting SMT production on said SMT pick and place machine; receiving display data relating to an SMT job from said SMT information database; and presenting said display data on said alphanumerical display.

In one example, the bin load units are comprised in a bin configured with a bin ID tag attached to the bins forward facing surface such that the surface is facing an operator, wherein said ID tag comprises an alphanumerical display controller unit and an alphanumerical display. Data relating to the number of components remaining in a bin load unit, such as a container or a component tape reel, is continuously sent from the pick and place machine to the SMT information database. A selection of the ID of the pick and place machine, the location into where the bin should be placed in the pick and place machine, the type of component and the number of remaining component is received as display data and presented on the alphanumerical display.

In one or more example embodiments, said display data is received via a communications network, which may be a wired and/or wireless communications network.

In one or more example embodiments, said display data relates to an SMT job retrieved from said SMT information database In one or more example embodiments, said bin has a bin ID tag in the form of a barcode attached to the bins forward facing surface such that the surface is facing an operator In one or more example embodiments, said communications network is an infrared network or a wireless local area network (WLAN).

In one or more example embodiments, the method further comprises sending said display information to an IR based system.

In one or more example embodiments, said display data is pushed down from a separate system.

In one or more example embodiments, the method step of receiving display data is preceded by scanning individual ID tags attached to bin load units, pallets, bins or pick and place machine magazines.

In one example, the display data is received only after an operator scans an individual ID tag.

At least one other example embodiment provides a bin in a SMT system is used for providing operator information, wherein said bin is adapted to be received in a SMT pick and place machine, and wherein said bin has a bin ID tag attached to the forward facing surface of the bin such that the surface faces an operator, and wherein said ID tag may also, or alternatively, comprise an alphanumerical display controller unit and a alphanumerical display.

In one example, a data structure indicating required components or bills-of-material for upcoming SMT jobs is received from the SMT information database. Bin load units corresponding to upcoming SMT jobs are loaded into bins and the bins are redistributed or moved based on given (or, alternatively, desired or predetermined) rules to improve and/or optimize presentation of bin load units at a port of said automated SMD warehouse.

Said given (or, alternatively, desired or predetermined) rules are based on information on component requirements of upcoming SMT jobs.

At least one of said given (or, alternatively, desired or predetermined) rules and said SMT job related information received or retrieved from said SMT database are based on, or provide, information on component requirements of upcoming SMT jobs.

In one example, information relating to upcoming SMT jobs SMT1, SMT2 and SMT3 is received, where the information comprises at least the required components or bills-of-material for upcoming SMT jobs SMT1, SMT2 and SMT3, and the sequential order they are planned to be executed or produced in the pick and place machine. The given (or, alternatively, desired or predetermined) rule is dependent on the sequential order SMT1, SMT2 and SMT3, and thus, bin load units comprising required components in SMT1 would be loaded into bins an placed or located closest to the port of the automated SMD warehouse. Bin load units comprising required components in SMT2 would further be loaded into bins a placed or located second closest to the port of the automated SMD warehouse and so forth.

According to at least some example embodiments, at least one of said given (or, alternatively, desired or predetermined) rules and said SMT job related information received or retrieved from said SMT database are based on, or provides, information on frequency of component use in previous SMT jobs.

In one example, the given (or, alternatively, desired or predetermined) rule is dependent on frequency of use. Statistical information relating to component requirements of previously executed SMT jobs is retrieved from a memory in the automated SMD warehouse or from the SMT information database. An example of statistical information indicating a relatively high frequency of use is the total number of components used or total number of components used per time unit. Bin load units comprising components with associated statistical information indicating the relative maximum frequency of use would be loaded into bins and placed or located closest to the port of the automated SMD warehouse. Bin load units comprising components with associated statistical information indicating the second relative maximum frequency of use would be loaded into bins placed or located second closest to the port of the automated SMD warehouse and so forth.

At least one of said given (or, alternatively, desired or predetermined) rules and said SMT job related information received or retrieved from said SMT database are based on, or provide, user indication data from received user indications.

In one example, the given (or, alternatively, desired or predetermined) rule is dependent on user indication data. Received user indication data indicates an operator's preferred order of components. Bin load units comprising components indicated in the user indication data would be loaded into bins a placed or located closest to the port of the automated SMD warehouse in the order indicated in the user indication data.

The given (or, alternatively, desired or predetermined) rules may be based on information on frequency of component use in previous SMT jobs and/or user indication data from received user indications.

When an operator is returning a bin to the automated SMD warehouse there is a need to determine the bin load units included in a bin by scanning a bin ID and retrieving the associated bin load units ID, such as pallet ID, container ID, component tape reel ID and SMT feeder ID, from an SMT information database.

When an operator is retrieving a bin from the automated SMD warehouse there is a need to associate a bin ID with the bin load units ID's, such as pallet ID, component tape reel ID and SMT feeder ID, by scanning a bin ID and storing the associated bin load units ID's, such as pallet ID, container ID, component tape reel ID and SMT feeder ID, to an SMT information database.

At least one other example embodiment provides a method in an automated SMD warehouse configured to store bins at given (or, alternatively, desired or predetermined) positions within said automated SMD warehouse, the method comprising: receiving a bin at a port of said automated SMD warehouse; and scanning an ID tag attached to said bin to obtain a bin ID.

At least one other example embodiment provides a method in an automated SMD warehouse adapted to obtain information related to upcoming SMT jobs, to store bins at given (or, alternatively, desired or predetermined) positions within said automated SMD warehouse, the method comprising: receiving a bin at a port of said automated SMD warehouse; scanning an ID tag attached to said bin to obtain a bin ID; storing said bin at a position within said automated SMD warehouse; and storing said position and said bin ID.

Said position and said bin ID may be stored as parameters, such as a table, in a memory of said automated SMD warehouse.

The position and said bin ID may be stored as parameters in an SMT information database via a communications network.

Figure 4:
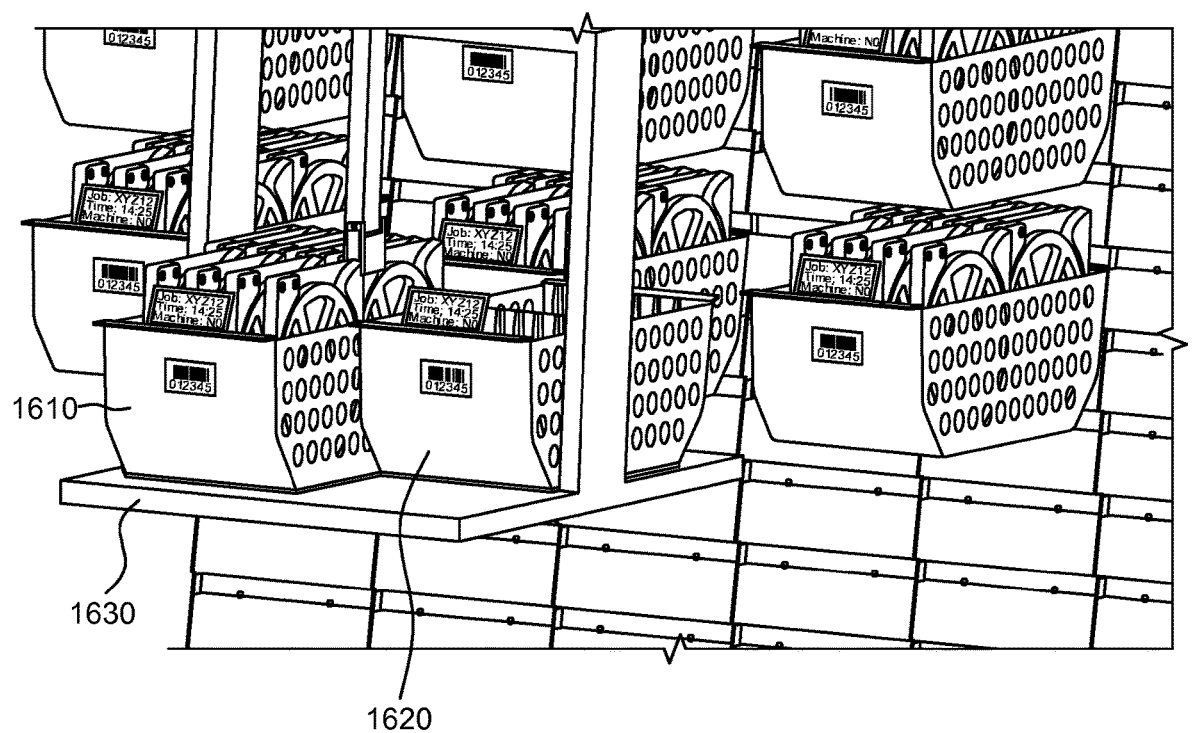
FIG. 4 shows schematically how bin load units are automatically redistributed between positions in the automated SMD warehouse using a table.

FIG. 4 shows an example of automatic redistribution of bin load units between positions in an example embodiment of an automated SMD warehouse using a table 1630.

Referring to FIG. 4, a first stored bin 1610 is retrieved to the table 1630 attached to an actuator in said automated SMD warehouse, and said actuator is moved to a position of a second stored bin 1620 within said automated SMD warehouse.

The second bin 1620 is retrieved to the table 1630, and the bin load units are automatically redistributed between positions in the automated SMD warehouse using a table by redistributing bin load units from said first bin 1610 to said second bin 1620.

Figure 5A:
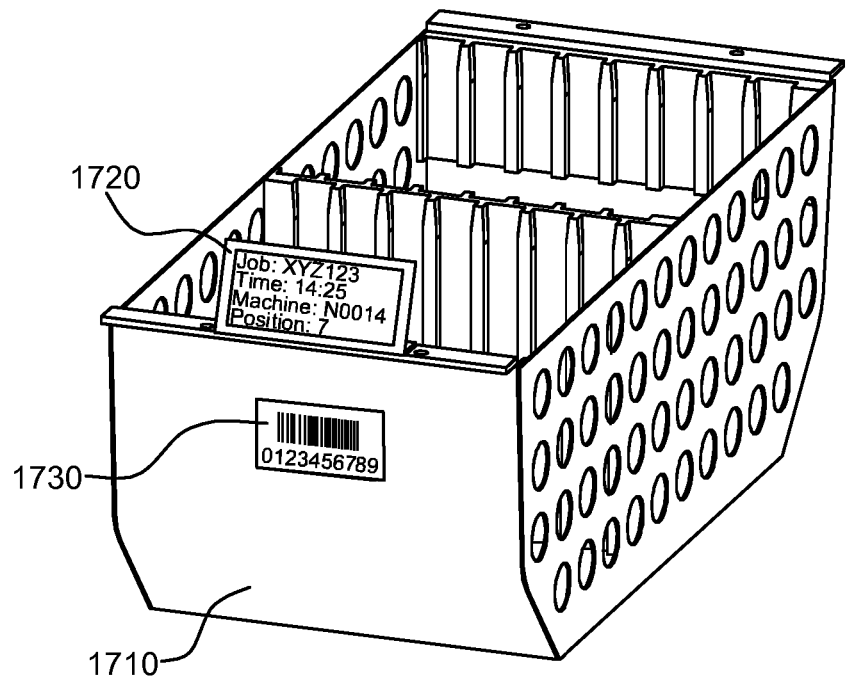
FIG. 5A shows an example embodiment in which a bin is configured with an alphanumerical display with an integrated alphanumerical display controller and an identity tag attached to said bin such that a bin ID may be obtained.

FIG. 5A shows an example embodiment in which a bin 1710 is configured with an alphanumerical display 1720 with an integrated alphanumerical display controller, and an identity tag 1730 attached to the bin 1710 such that a bin ID may be obtained. In one example, this identity tag 1730 is a barcode.

Figure 5B:
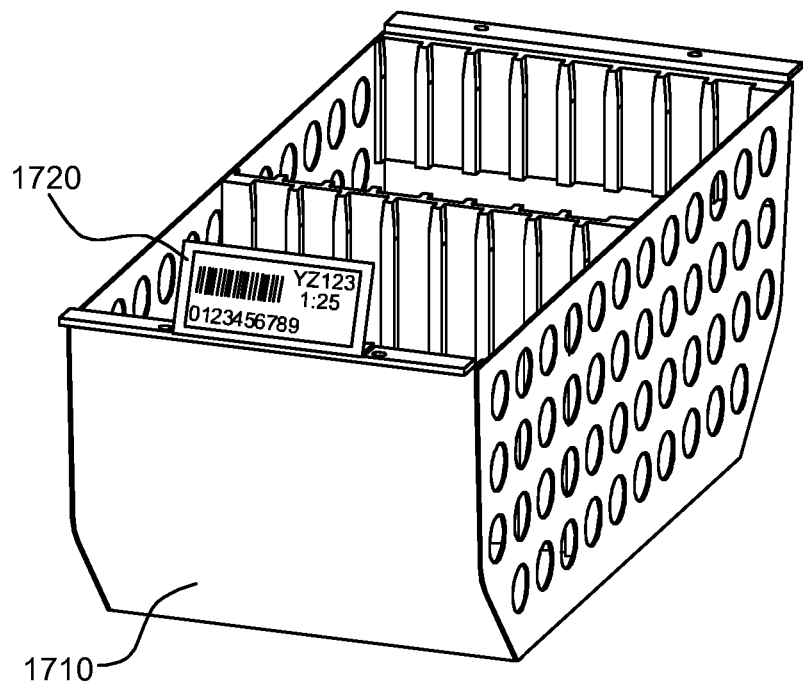
FIG. 5B shows an example embodiment in which a bin is configured with an alphanumerical display with an integrated alphanumerical display controller, wherein display data comprises a bin ID.

FIG. 5B shows an example embodiment in which a bin 1710 is configured with an alphanumerical display 1720 with an integrated alphanumerical display controller, wherein display data on the alphanumerical display comprises a bin ID, wherein said bin ID is presented as a barcode, QR code or the like. Thus, the alphanumerical display 1720 also functions as an ID tag of the bin. In one or more example embodiments, the communications network ID of the alphanumerical display 1720, used to send data to and receive data from the alphanumerical display controller, is the same or substantially the same as the bin ID.

FIGS. 6A through 6D show schematically how planning, associating, loading, replenishment and unloading may be performed in accordance with a use case example of a typical workflow in a SMT system according to an example embodiment.

Referring to FIGS. 6A through 6D, a planning user starts the workflow by planning an SMT job to be executed, and stores said SMT job in an SMT information database. In a use case example referring to FIG. 6A, a planning operator uses an SMT planning tool, for example, a graphical user interface of a computer program that is adapted to help the user improve and/or optimize the job sequence and change-over strategy for incoming orders to plan an SMT job. The outcome of the planning is typically a bill of materials 1910 (also referred to herein as SMT job data). The bill of material/SMT job data is sent to the automated SMD warehouse 1912 (e.g., corresponding to the SMD warehouse 93 in FIGS. 1 and 200 in FIG. 2 discussed herein).

In response to receiving the bill of materials/SMT job data 1910, the automated SMD warehouse 1912 automatically delivers bin load units 1914 (e.g., in the form of any bin load unit). In this example, the bin load units 1914 may be in the form of component tape reels and/or containers. Typically, the bin load units delivered from the automated SMD warehouse 1912 are already in the correct order for loading into bins. An SMT operator (e.g., a human being or alternatively a robot) then retrieves the bin load units that are delivered from said automated SMD warehouse 1912, and possibly also substrates from separate storage or from said automated SMD warehouse 1912. In this example, the SMT operator retrieves component tape reels and/or containers from the automated SMD warehouse 1912, and prepares the component tape reels and/or containers for loading into the pick and place machine 1924.

The SMT operator places the one or more associated component pairs into a bin 1920. The bin may, for example, correspond to any bin discussed herein. When a bin is ready, the SMT operator places/loads the bin in the pick and place machine 1924. The pick and place machine 1924 may correspond to the pick and place machine 91 shown in FIG. 1.

In order for the pick and place machine 1924 to know which settings are to be used, SMT job data from the planning step is provided to the pick and place machine 1924, either directly from the planning tool or by the SMT operator scanning the barcode of a work order 1922, using a scanner 1918, comprising the required information/SMT job data. This is illustrated in more detail in FIG. 6B.

Based on the input SMT job data, machine programs are selected automatically, as are conveyor width and loader/unloader settings. In other words, for example, loading into the pick and place machine 1924 is faster and easier for the SMT operator as it requires no manual data entry—just one or two scans of barcodes or other identifiers. As soon as the line is up and running, the SMT operator is free to start preparing the next SMT job. Also, as all bins and feeders are given a unique ID, the SMT operator may check quantity, location, MSD data and batch codes, for a single component or a complete component list for an SMT job, at any point during production.

If, at any time, components are about to run out, the machine alerts the operator, re-optimizes and continues mounting other components. The SMT operator that notices such an alert may, for example, press a "provide" button or the like, whereby the SMD warehouse 1912 immediately delivers the requested component(s) 1914 for the SMT operator to retrieve, associate and load into the pick and place machine 1924 to replenish the machine. This is illustrated in more detail in FIG. 6C.

One or more example embodiments may also have a plug-and-play simplicity, which means that the SMT operator may load and unload bins in seconds, saving operator time. Specially designed software automatically recognizes the presence, absence and location of components, which means that there is no need to program pick positions and production does not stop if a bin runs out of parts.

Figure 6A:
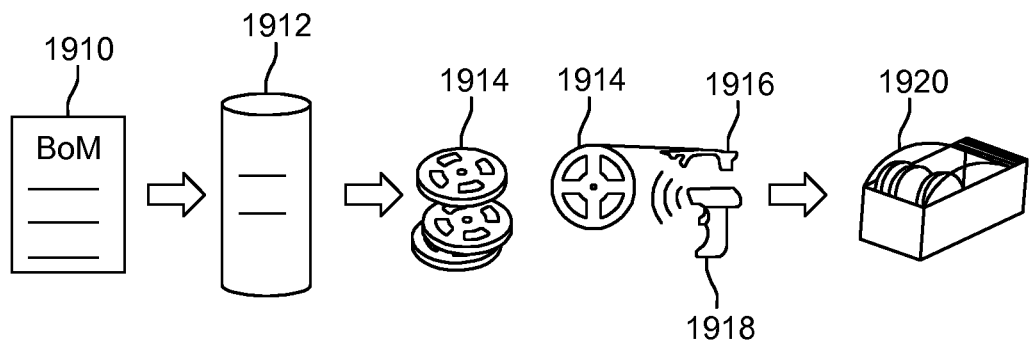
FIGS. 6A-6D show schematically how planning, associating, loading, replenishment and unloading may be performed in accordance with a use case example of a typical workflow in a SMT system, according to an example embodiment.
Figure 6B:
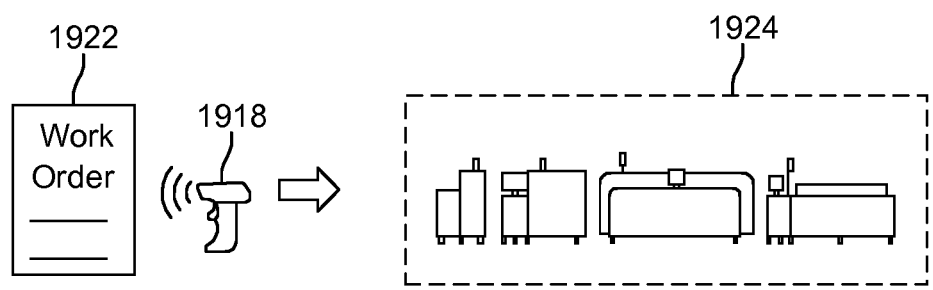
Figure 6C:
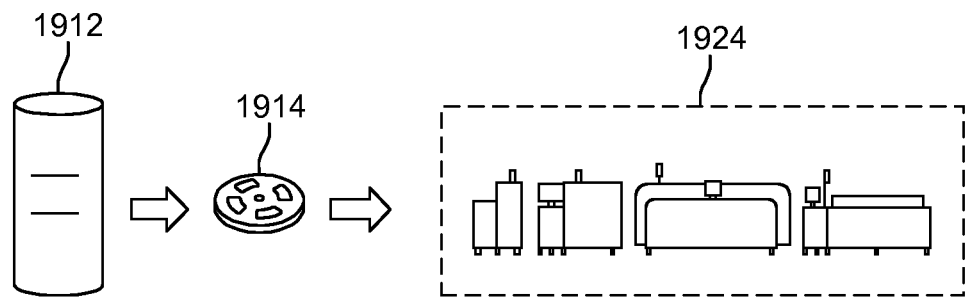
Figure 6D:
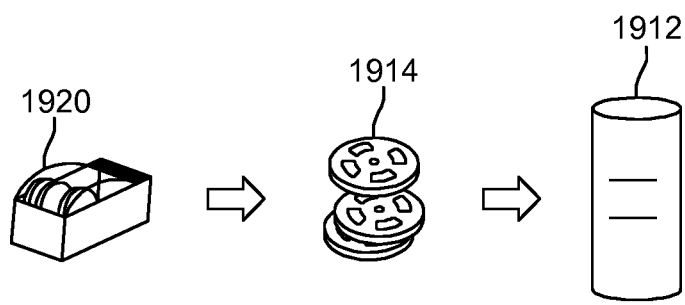

As illustrated in FIG. 6D, when an SMT job is done, or when the work day ends, the SMT operator unloads the bins 1920 from the pick and place machine, removes the containers 1914 from the bin and places them back into an SMD warehouse 1912, which may be the same as, or different from, the one from where the components where retrieved. As each component has an identifier, the system keeps track of the components and mix-ups are avoided.

Figure 3:
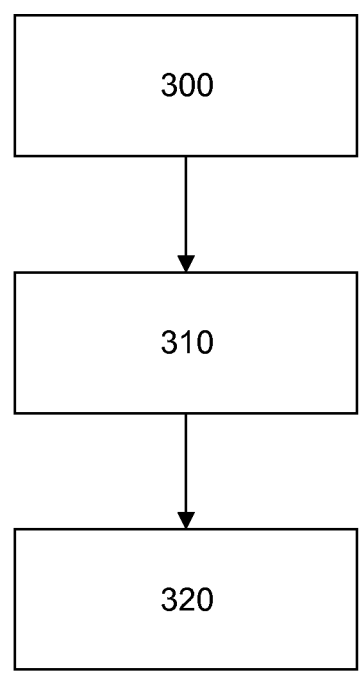
FIG. 3 shows a SMT method for presenting a retrieved bin at a port of an automated SMD warehouse.

FIG. 3 shows an example embodiment of a method for presenting a retrieved bin at a port of an automated SMD warehouse in a SMT system. In more detail, FIG. 3 shows an example embodiment in the form of a method in an automated SMD warehouse adapted to obtain information related to upcoming SMT jobs, to store bins at given (or, alternatively, desired or predetermined) positions within said automated SMD warehouse and to retrieve bins at given (or, alternatively, desired or predetermined) positions within said automated SMD warehouse, wherein said bins are adapted to comprise bin load units, wherein said bin load unit comprises at least a component tape reel and/or a container.

Referring to FIG. 3, at 300 the SMD warehouse receives input data.

At 310, the automated SMD warehouse retrieves a bin based on said input data and a parameter representing a position within said automated SMD warehouse. In at least this example, said bin is adapted to comprise bin load units, wherein said bin load unit comprises at least a component tape reel and/or a container. Alternatively, the automated SMD warehouse may retrieve a container.

At 320, the automated SMD warehouse presents said retrieved bin at a port of said automated SMD warehouse.

In at least one non-limiting example, the input data received at 300 may be descriptive of one or more sets of components, component 1, component 2, ... component P. A bin is retrieved based on said input data and a parameter representing a position within said automated SMD warehouse. In one example, the parameter may be comprised in a data structure stored in the SMD warehouse, such as a table, descriptive of a component tape ID, bin ID, container ID, or pallet ID and a position within said SMD. Example parameters are shown below in Table 1.

TABLE 1

| Identity | X-position | Y-position | Z-Position |
|---|---|---|---|
| Container/Box Identity 1 | X1 | Y1 | Z1 |
| Container/Box Identity 2 | X2 | Y2 | Z2 |
| Container/Box Identity 3 | X3 | Y3 | Z3 |
| Container/Box Identity 4 | X4 | Y4 | Z4 |

In another example, the parameter may be comprised in a data structure, such as a table, descriptive of a component tape ID, bin ID, container ID, pallet ID, and/or a position within said SMD. An example in which the parameter includes a shelf ID is shown below in Table 2.

TABLE 2

| Identity | Shelf ID |
|---|---|
| Container/Box Identity 1 | S1 |
| Container/Box Identity 2 | S2 |
| Container/Box Identity 3 | S3 |
| Container/Box Identity 4 | S4 |

The X, Y, Z position or the shelf ID of the container and/or box may be obtained by performing a look-up in the parameter table based on the input data to obtain the position within said automated SMD warehouse (e.g., (X1,Y1,Z1), (Shelf 34), etc.). The bin or bins located at the obtained position within said automated SMD warehouse are then retrieved and presented at a port of said automated SMD warehouse.

The automated SMD warehouse may further comprise an input/output interface and said input data is received from said input/output interface based on an operator indication of an upcoming SMT job.

In one example, an operator enters the identity of an upcoming SMT job, and the automated SMD warehouse retrieves or receives the identities of components associated with, comprised in or required in the upcoming SMT job from said SMT information database, such as container ID, component tape reel ID or pallet ID. The X, Y, Z position or the shelf ID may be obtained by performing a look-up in the parameter table based on the retrieved or received identities of components to obtain the position within said automated SMD warehouse, (e.g., (X1,Y1,Z1), (Shelf 34), etc.). The bin or bins located at the obtained position within said automated SMD warehouse are then retrieved and presented at a port of said automated SMD warehouse.

In one or more example embodiments, said input data is received or retrieved from an SMT information database and said input data is associated with or included in an upcoming SMT job.

In one example, the input data descriptive of an upcoming SMT job is pushed by or received from the SMT information database via the communications network, the automated SMD warehouse retrieves or receives the identities of components associated with, comprised in or required in, the upcoming SMT job from said SMT information database, such as container ID, component tape reel ID or pallet ID. The X, Y, Z position or the shelf ID is obtained by performing a look-up in the parameter table based on the retrieved or received identities of components to obtain the position within said automated SMD warehouse (e.g., (X1,Y1,Z1), (Shelf 34), etc.). The bin or bins located at the obtained position within said automated SMD warehouse is then retrieved and presented at a port of said automated SMD warehouse.

Said parameter may represent a position within said automated SMD warehouse, and is retrieved from a memory in said automated SMD warehouse.

In one example, the parameter representing a position within said automated SMD warehouse is an X, Y, Z position and/or the shelf ID, and is obtained or retrieved by performing a look-up in a parameter table based on the retrieved and/or received identities of components to obtain the position within said automated SMD warehouse (e.g., (X1,Y1, Z1), (Shelf 34), etc.).

An automated SMD warehouse and/or storage unit may be further configured to automatically redistribute bin loading units within a bin or between two or more stored bins, for example, for replenishment purposes when the automated SMD warehouse is concurrently occupied with storing or retrieving bins or for improvement and/or optimization of upcoming SMT jobs or storage space in the SMD warehouse during idle periods when the automated SMD warehouse is not occupied with storing or retrieving bins. The automatic redistribution may be performed according to certain conditions applied to input data received from an operator or retrieved from said SMT information database, such as component requirements of upcoming SMT jobs. The automatic redistribution may also be performed based on frequency of component use or maximum storage capacity. As an example, a bin or multiple bins may be loaded with component tape reels or containers needed to produce the next SMT job.

According to at least some example embodiments, a plurality of automated SMD warehouses may be configured to form an integrated automated SMD warehouse cluster, wherein bin load units may be redistributed between a first and a second automated SMD warehouse via a first opening in the first automated SMD warehouse and a second opening in the second automated SMD warehouse, wherein a first actuator in the first automated SMD warehouse is configured to grip a bin load unit in the second opening and a second actuator in the second automated SMD warehouse is configured to grip a bin load unit in the first opening such that bin load units may be passed from said first SMD warehouse and said second SMD warehouse.

Figure 7:
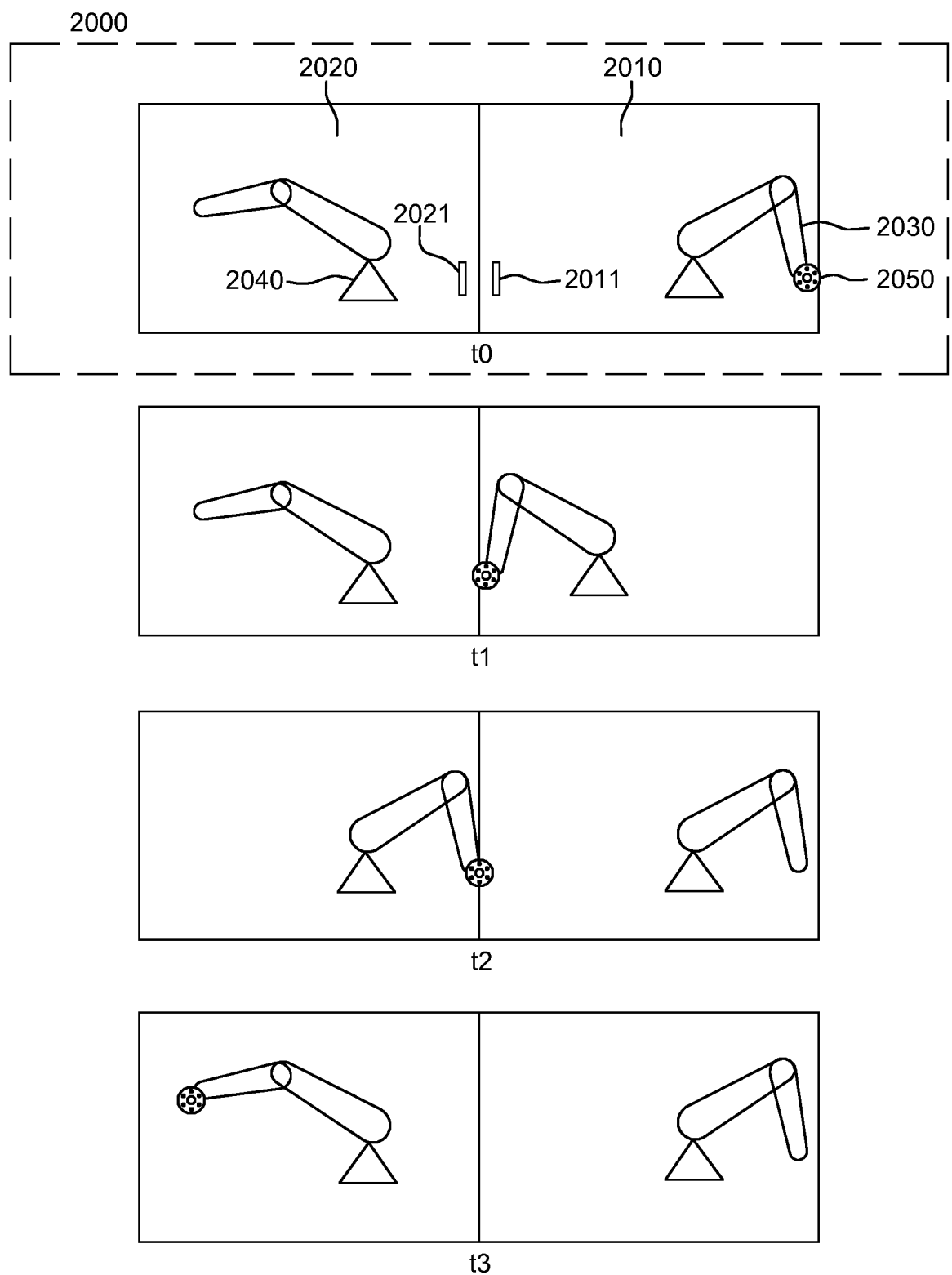
FIG. 7 illustrates an example of a time sequence of how bin load units may be redistributed between a first and a second automated SMD warehouse in an integrated automated SMD warehouse cluster.
Figure 8A:
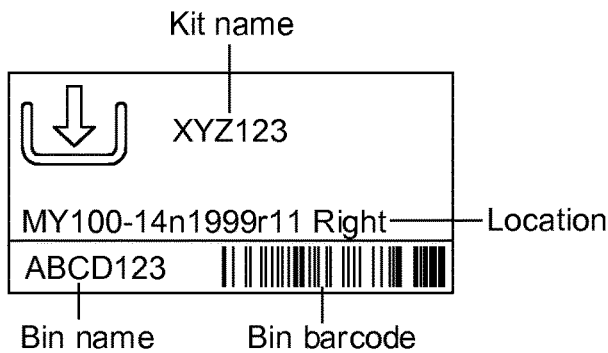
FIGS. 8A through 8F illustrate various ESL tags according to example embodiments.
Figure 8B:
Figure 8C:
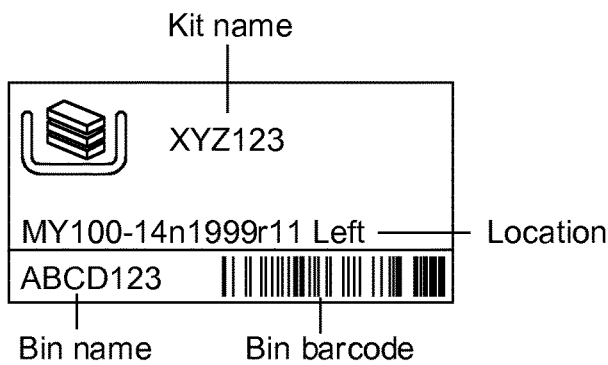
Figure 8D:
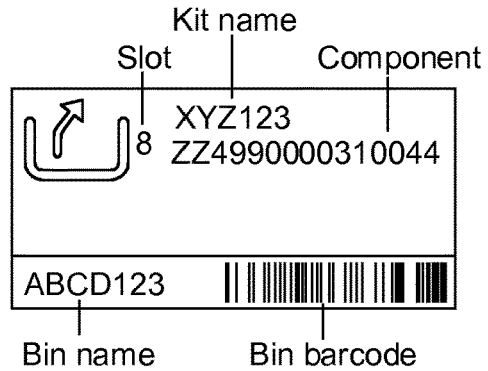
Figure 8E:
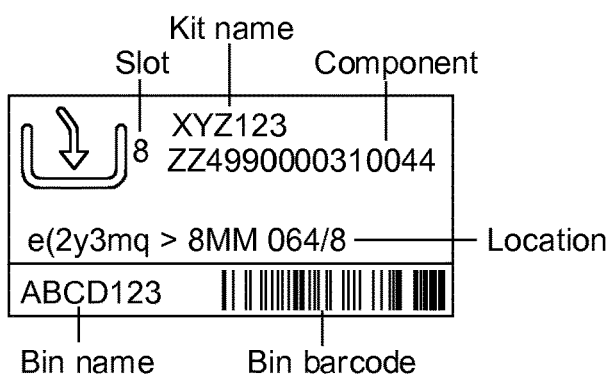
Figure 8F:

FIG. 7 illustrates an example of a time sequence on how bin load units may be redistributed between a first and a second automated SMD warehouse in an integrated automated SMD warehouse cluster.

Referring to FIG. 7, a first SMD warehouse 2010 and a second SMD warehouse 2020 are configured to form an integrated automated SMD warehouse cluster 2000. The first SMD warehouse 2010 is configured with a first opening 2011 aligned with a second opening 2021 in the second SMD warehouse 2020, such that bin load units may be redistributed between the first 2010 and the second automated SMD warehouse 2020 via the first opening 2011 in the first automated SMD warehouse 2010 and the second opening 2021 in the second automated SMD warehouse 2020.

At time t0, a first actuator 2030 in the first automated SMD warehouse 2010 grips a bin or bin load unit 2050 stored in the first automated SMD warehouse.

At time t1, the first actuator 2030 transports said bin or bin load unit 2050 to said first opening 2011. Further, said first actuator 2030 releases the grip of the bin or bin load unit 2050 in a position where said bin or bin load unit protrudes into said second opening 2021 in said second SMD warehouse 2020. Alternatively, the first actuator 2030 in the first automated SMD warehouse releases the grip of the bin or bin load unit 2050 in the first opening 2011.

At time t2, a second actuator 2040 in the second automated SMD warehouse 2020 is configured to grip the bin load unit 2050 protruding into said second opening 2021 in said second SMD warehouse 2020. Alternatively, the second actuator 2040 in the second automated SMD warehouse 2020 is configured to grip the bin or bin load unit 2050 in the first opening 2011 such that bins or bin load units can be redistributed from said first SMD warehouse 2010 and said second SMD warehouse 2020.

Still referring to FIG. 7, at time t3 the second actuator 2040 in the second automated SMD warehouse 2020 releases the grip and stores the bin or bin load unit 2050 in the second automated SMD warehouse 2020.

Although not shown in FIG. 7, the method of automatically redistributing bin load units may further comprise: removing a first bin load unit from a first stored bin by a first actuator in said automated SMD warehouse; moving said first actuator to a position of a second stored bin within said automated SMD warehouse; removing a second bin load unit in a second stored bin by a second actuator in said automated SMD warehouse; and inserting said first bin load unit in said second stored bin by said first actuator. Bin load units loaded in the same bin may be redistributed within the same bin (e.g., to improve and/or optimize the utilization of a bin).

Although not shown in FIG. 7, the method of automatically redistributing bin load units may further comprise: moving said second actuator to a position of a third stored bin within said automated SMD warehouse; and inserting said second bin load unit in said third stored bin by said second actuator. Moreover, the automated SMD warehouse may redistribute containers, rather than bins, in the same or substantially the same manner.

In at least one example embodiment, the automated SMD warehouse may include a dedicated redistribution area, where bin load units can be redistributed between at least two bins.

Although not shown in FIG. 7, the method of automatically redistributing bin load units may further comprise: retrieving and moving a first stored bin to a redistribution area within said automated SMD warehouse; and retrieving and moving a second stored bin to said redistribution area within said automated SMD warehouse.

In at least one example embodiment, the automated SMD warehouse comprises a table attached to a first or second actuator, where bin load units may be redistributed between at least two bins. Two bins may be placed on the table and bin load units may be redistributed from the first bin to the second bin and vice versa.

Although not shown in FIG. 7, the method of automatically redistributing bin load units may further comprise: retrieving and placing a first stored bin on a table attached to an actuator in said automated SMD warehouse; and moving said actuator to a position of a second stored bin within said automated SMD warehouse.

To allow more flexible scaling of the automated SMD warehouse, several SMD warehouse units may be coupled together so that bins may be passed from a first SMD warehouse to a second SMD warehouse, and bin load units can be passed from a first SMD warehouse to a second SMD warehouse. Thus, redistribution of bin load units may be obtained between a plurality of automated SMD warehouses.

To further enhance the operation of actuators in the automated SMD warehouse, a bin may be configured with a given (or, alternatively, desired or predetermined) gripping area for an actuator to grip. The bin may be further configured with guide rails for each compartment in the bin, wherein each compartment is adapted to receive a pallet. A pallet refers to an accumulator device for electronic components on a component tape reel or container. A pallet is adapted with attachment arrangements allowing storage in a carrier such as a bin, a position in an automated SMD warehouse and a position in a SMT pick and place machine.

A bin may be adapted with a given (or, alternatively, desired or predetermined) gripping area for the actuator to grip, and with guide rails adapted to receive a pallet.

The bins may be adapted to comprise bin load units, wherein said bin load unit includes at least a component tape reel or a container.

Redistributing may be performed during idle periods, wherein the idle periods are periods in which the automated SMD warehouse is not occupied with storing or retrieving bins and/or bin load units.

In one or more example embodiments, a bin is configured with an electronic display such as alphanumerical display, with an integrated display controller, and a printed identity tag attached to said bin such that information relating to an SMT job is displayed and a bin ID may be obtained by scanning (e.g., optically scanning a barcode) the printed identity tag.

In one or more example embodiments, a bin is configured with an electronic display such as an alphanumerical display with an integrated alphanumerical display controller, display data may comprise information about the reels carried by said bin and/or a bin ID, and said bin ID is presented as an optically scannable code such as a barcode, QR code or the like.

In one or more example embodiments, an alphanumerical display functions as an ID tag of the bin. In one or more example embodiments, the communications network ID of the electronic display, used to send data to and receive data from the electronic display controller, such as an electronic alphanumerical display, is the same or substantially the same as the bin ID.

In one or more example embodiments, scanning comprises scanning an optically scannable code such as a barcode, QR code or the like, and the optically scannable code is presented on a printed label or an electronic display such as an electronic alphanumerical display.

In one or more example embodiments, the electronic display (e.g., an electronic alphanumerical display) is attached to a bin and displays an electronic barcode representing a unique bin ID of the bin and/or that the electronic display is further representing and showing SMT job related information to the operator (e.g., information about each of the individual bin load units, such as component tape reels) stored in one of the compartments of the bin.

At least one example embodiment provides an electronic shelf label (ESL) system using radio frequency identification (RFID) that may store, in an ESL tag attached to a shelf, bin and/or container, SMT job information received from an ESL server, thereby readily updating the details included in the ESL tag/display, and an operation method of the ESL system.

At least one other example embodiment provides an ESL system using RFID that may obtain identification information of a bin load unit, such as a component tape, container, or component tape reel positioned on a shelf, from a recognition tag attached to the component tape reel or container, and provide the obtained identification information to an ESL server, thereby enabling a manager to readily plan and manage SMT-related jobs/actions involving the stored component tape (e.g., replenishment work, loading a bin with reels in the compartments of the bin, preparing for a SMT pick-and-place job) and to effectively manage and provide instructions related to the container and decrease costs for managing human resources, and an operation method of the ESL system.

An ESL system using RFID, may include: an ESL tag to be attached to a shelf; and a radio tag reader to store, in the ESL tag, details received from an ESL server (e.g., originating from the SMT information database), in response to an SMT information update request from the ESL server (or SMT information database via a separate ESL system to the shelf tags/displays).

An operation method of an ESL system using RFID may include: receiving details regarding an SMT job from an ESL server together with an SMT job information update request from the ESL server; storing the received details in an ESL tag attached to a shelf; and displaying the received details.

An ESL tag according to one or more example embodiments may include, or be associated with, one or more pressure sensitive buttons to enable an operator to change the information displayed on the ESL tag and dynamically update SMT-job related information, which frequently varies.

The pressure sensitive buttons may be used to confirm actions, trigger actions, and/or modify the content of the display itself. Pressing of the pressure sensitive buttons may send an immediate trigger to an external system, or store information to be sent at a next scheduled communication event (e.g., a periodic communication event). The action may also be local and change between given (or, alternatively, desired or predefined) information sets.

In more detail, for example, an operator may use the pressure sensitive buttons to confirm an action related to the display (e.g., component picked from a shelf location) without using a barcode scanner (having both hands free for picking the related object). In another example, the operator may use the pressure sensitive buttons to change the displayed content immediately, for example, from component name to component quantity or next action for the object.

According to one or more example embodiments, the pressure sensitive buttons may include one or several buttons, and may be mechanical, optical, electrical, touch screen, etc.

In response to pressing of the pressure sensitive buttons, the ESL tag may inform a controlling system (e.g., base station and related software) that a button on the ESL tag has been pressed, save the button pressed information to be available at the next scheduled communication event, and/or directly trigger a change in the display on the ESL tag between given (or, alternatively, desired or predefined) messages.

An ESL tag attached to a shelf may store details (e.g., SMT job related information) received from an ESL server, thereby readily updating the details included in and/or displayed on the ESL tag.

FIGS. 8A through 8F illustrate various ESL tags according to example embodiments. As shown in FIGS. 8A through 8F, the ESL tags may include pick and place information, such as one or more of slot, kit name, location, bin name, bin barcode, component name, etc. The pick and place information may be arranged as desired on the ESL tag.

According to one or more example embodiments, the ESL tags may be displays and/or electronic labels arranged on component shelves, bins, trolleys, bin load units, pallets, containers, SMT pick and place machines, etc.

According to one or more example embodiments, identification information of a container positioned on a shelf may be obtained from an ESL tag attached to the shelf edge or the container. The obtained identification information may be provided to an ESL server, thereby enabling the ESL system (IR-based or RFID-based) to readily perform inventory of container stored at storage positions/shelves, push down to the ESL tags (e.g., a display touch screen an electronic dynamic label) on the shelf edges associated with a stored container and (dynamically through event-triggered automatic pushed down instructions) change SMT job related information on the displays. Therefore, it is possible to effectively manage and trace containers, and thereby decrease costs for managing human resources.

E-label tags/electronic displays, according to one or more example embodiments, display shelf location content in form of SMT job related information similar to smart labels on shelves for easy component tape fetching. An IR-based or RFID-based Electronic Shop/Shelf Label (ESL) system may be used to provide (e.g., dynamically/automatically changing) the SMT job related information (from the SMT information database) on the displays (e.g., during a kitting process, a replenishment process, when loading a bin with containers in preparation of a pick-and-place job).

The above ESL, where the SMT operator preparing SMT pick-and-place jobs have an input possibility on (or associated with) an external display unit, where the input mechanism may be one or several buttons (mechanical, electrical or optical) or a touch screen on the display itself, and where the internal action of the operator may be at least one of: direct sending a button pressed message to a controlling system (base station and related software, the SMT information database via an IR and/or RFID-based ESL system); saving the button pressed message to be available at the next scheduled communication event; and directly triggering a display content change (e.g., between given or, alternatively, desired or defined messages).

The e-labels may be configured to (dynamically/automatically) change their appearance to clearly indicate to the SMT job operator where to pick the needed components for an upcoming SMT pick-and-place job (e.g., based on pushed down instructions from the SMT information database using or via a separate ESL system or the operator's pushing of a button). For example, the electronic displays may dynamically change from dark to bright, change color, and indicate in which order the containers and/or boxes (bin load units) shall be more optimally fetched by the operator from the shelves or stored in compartments of a bin (for storing containers).

The electronic labels shown in FIGS. 8A through 8F may also be arranged on containers. Example arrangements for electronic labels will be discussed in more detail later.

Figure 9A:
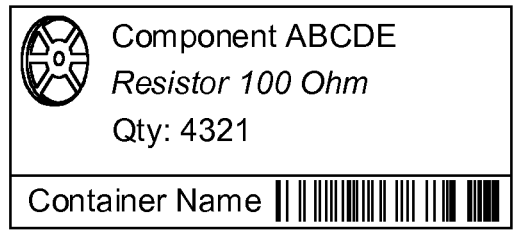
FIGS. 9A through 9D illustrate examples of four e-labels according to example embodiments.
Figure 9B:
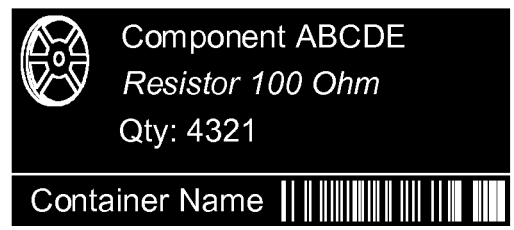
Figure 9C:
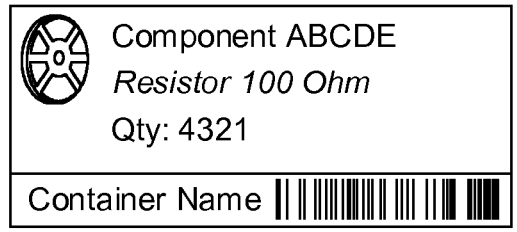
Figure 9D:
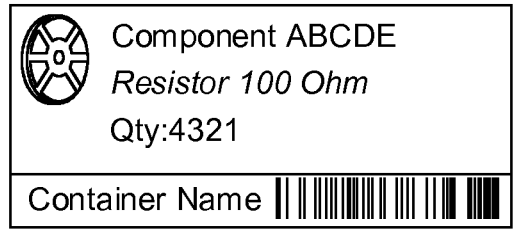

FIGS. 9A through 9D illustrate examples of four e-labels. As shown, the e-label in FIG. 9B is an example in which e-label has dynamically changed from bright to dark based on pushed down instructions from the SMT information database using or via a separate ESL system or the operator's pushing of a button. The example e-labels shown in FIGS. 9A through 9D may also be arranged on containers as discussed in more detail later.

The e-labels shown in FIGS. 8A through 9D may be logically and electronically unique IDs in the SMT system represented by a barcode or RFID tag arranged on the container, said unique ID of the container being configured to be associated with each of the unique IDs of said plurality of SMT-job related objects stored in at least one compartment of a container. The barcode or RFID tag arranged on the container may be configured to be linked in the SMT database to the each of the unique IDs of said plurality of SMT-job related objects stored in the at least one compartment by the at least one of the actions of scanning barcodes and/or reading RFID tags in sequence using a barcode scanner or RFID tag reader.

The shelves for storing containers (e.g., "bin load units" in form of packets), where at least one electronic label/tag is attached to a shelf edge for each storage location on each shelf.

According to at least some example embodiments, the technology disclosed allows for the use of at least one sensor/detector for detecting/indicating when/whether a container is fetched from (or stored at) the storage location on the shelf (by the operator or a robot) and send uplink information to the ESL system (to be forwarded to SMT information database system), or send it directly to the conventional SMT information database system.

By using modern electronic paper (e-paper) labels information about the various phases during material handling will be displayed just in front of the operator when he/she needs the information.

With the smart e-labels it is possible to show an operator what to do independently if the bin is in the machine or in the kitting area.

At least one other example embodiment provides a smart barcode scanner display configured to display SMT job related information (e.g., direct instructions to the operator) when scanning a barcode (e.g., on a container, a component tape reel, a pallet for carrying a container or component tape reel, or an electronic shelf label/display) during, for example, a kitting process, a replenishment process, when loading a bin with containers in preparation of a pick-and-place job, etc.

Figures 10A, 10B, 10C, 10D:
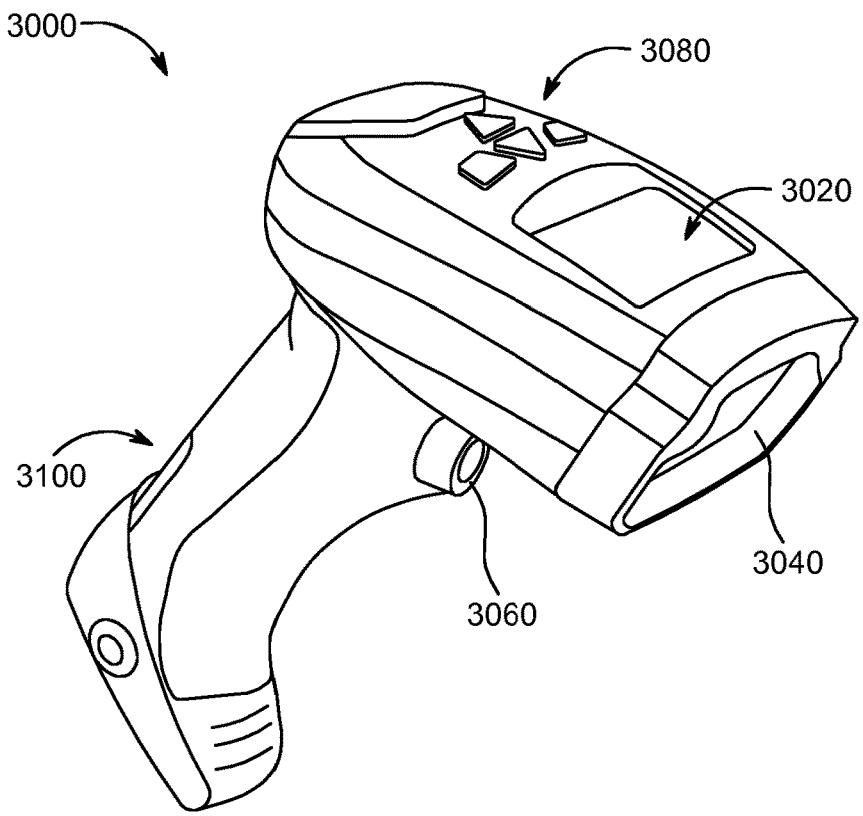
FIG. 10A is a perspective view of a barcode scanner according to an example embodiment.
FIGS. 10B through 10D illustrate example displays output on the display of the barcode reader, according to an example embodiment.

FIG. 10A is a perspective view of a barcode scanner according to an example embodiment.

Referring to FIG. 10A, the barcode scanner 3000 includes a handle 3100, a trigger 3060, a scanner input device 3040, a display 3020, and input buttons 3080. The barcode scanner 3000 may also include a memory, a processor, and a wireless transceiver to communicate wirelessly with an ESL system.

The smart barcode scanner 3000 with the display 3020 may be used to display SMT job related information to the SMT operator in order to guide the operator on what to do with an object (e.g., a container) corresponding to the scanned barcode. This enhancement to the material handling process by the provision of guidance to the operator (e.g., sequentially provided and/or event-based triggered guidance SMT job related information) provides improved traceability and/or less error-prone kitting and replenishment processes.

An IR-based or RFID-based ESL system may be used for providing (e.g., dynamically/automatically changing) the SMT job related information from the SMT information database on the barcode scanner display 3020.

When preparing for upcoming SMT pick-and-place jobs, the SMT operator handling the barcode scanner 3000 with the display 3020 may also have an input possibility on (or associated with) a barcode or an external display unit, where the input mechanism may be the scanning of a barcode (e.g., a conventional barcode on a container or on, or associated with, an ESL display itself) by the scanner input device 3040, and where the barcode scanning action of the operator may be sending data (e.g., through IR or RFID data) to a controller unit associated with the barcode or an external display unit. The controller unit may trigger: sending direct uplink SMT job related information to a controlling system (e.g., a base station and related software, the SMT information database via an IR and/or RFID-based ESL system); saving SMT job related information to be available at the next scheduled communication event; or displaying content on the barcode scanner display to change (e.g., between given or, alternatively, desired or predefined messages).

The trigger 3060 may be used to activate the scanner input device 3040 to perform a scanning operation. The buttons 3080 may be used to modify/update information on the display 3020, and transmit the updated information to the ESL system to update the ESL database.

The barcode scanner display 3020 may be configured to change its appearance to more clearly indicate to the SMT job operator where to pick the next a container for an upcoming SMT pick-and-place job. In one example, the barcode scanner display 3020 may change its appearance in response to the scanning of a barcode by the operator or pushed down instructions from the SMT information database using or via a separate ESL system or the operator's pushing of a button. The barcode scanner display 3020 may automatically/dynamically change from dark to bright and/or change color to indicate to the operator in which order the container should be at least one of: loaded into a bin; fetched by the operator from storage shelves in a kitting or replenishment process; or stored in an automatic SMD component warehouse including a robot.

The ESLs discussed herein may be e-paper labels.

The barcode scanner display 3020 may show an operator what to do independently if the bin is in the machine or in the kitting area (e.g., during a replenishment process or kitting process). The barcode scanner display may also be used to directly show what the operator has on the shelves, and sequentially guide the operator in collecting the containers.

One or more example embodiments may enhance the material handling process to reduce the effort of bringing and tracking components during kitting and replenishment processes (e.g., improved traceability and more efficient and less error prone SMT job related actions performed by the operator).

FIGS. 10B through 10D illustrate example displays output on the display of the barcode reader.

In more detail, FIG. 10B illustrates example content displayed when scanning a bin for loading into a pick and place machine.

FIG. 10C illustrates example content displayed when scanning a feeder for loading.

FIG. 10D illustrates example content when scanning an action barcode.

Using electronic tags or labels comprising electronic barcodes to track bins, trolleys, containers, and the components carried by, contained in or associated with, the bins, trolleys, or containers, and display SMT job related information related to said bins, trolleys, containers, and associated components, the system of the technology disclosed reduces the risk of error and speeds up setup and changeover times. It keeps track of quantity, batch code, current location and floor life for each and every component.

At least some example embodiments may inform and give guidance to the operator by providing, for the operator to view, display data from the factory floor on displays or electronic labels during production, and integrate it with a factory-wide tracking system or export display data for further processing. The displays or electronic labels may be associated with and/or may be attached to a carrier (e.g., a bin, a movable trolley or a container adapted for carrying at least one plastic bag with components), a shelf for storing components or a table for performing replenishment work or kitting work.

The display or electronic label is provided with an electronic barcode that can be scanned by the operator using a barcode reader in order to display information to the operator related to the preparation for an ongoing or upcoming pick-and-place job (e.g., replenishment work, kitting work or during loading of a container).

The displays or electronic labels are provided with at least one electronic barcode that may be scanned by the operator using a barcode reader in order to automatically (e.g., via a software tool and/or network of the SMT system) initiate an update of SMT job information in the SMT information database, where the updated SMT job information can subsequently be retrieved by the pick-and-place machine, the SMD warehouse or other units of the SMT system, retrieved by the action (e.g., scanning of a barcode, such as an electronic barcode) or other request of the operator or automatically pushed down (e.g., using software creating, such as a bitmap image, provided to the control unit of a separate communications network and system, such as an ESL system discussed above that pushes down display data to the displays or electronic labels) to guide the operator in preparation of an ongoing or upcoming pick-and-place job (e.g., replenishment work, kitting work or during loading of a container or box).

The display or electronic label of the carrier, table or shelf is further associated with or provided with an input device that can be activated or pushed by the operator in order to display information to the operator related to the preparation for an ongoing or upcoming pick-and-place job (e.g., replenishment work, kitting work or during loading of a container).

The display or electronic label of the carrier, table or shelf is provided with an input device that can be used, activated or pushed by the operator to provide input (e.g., event-based input) to the control unit of the display/electronic label in order for the control unit of the display/electronic label to provide display information to the operator related to the preparation for an ongoing or upcoming pick-and-place job (e.g., replenishment work, kitting work or during loading of a container).

The display or electronic label is provided with an input device that can be used, activated or pushed by the operator to provide input (e.g., event-based input) to the control unit of the display/electronic label in order for the control unit of the display/electronic label to automatically (e.g., via a software tool and/or network of the SMT system) initiate an update of SMT job information in the SMT information database, where the updated SMT job information can subsequently be automatically retrieved by the pick-and-place machine, the SMD warehouse or other units of the SMT system, retrieved by a request of the operator or automatically pushed down (e.g., via a software tool and control unit creating image data, e.g., bitmap image data, that is sent to the a separate communications network and system, e.g., ESL system that pushes down display data to the displays/electronic labels) to guide the operator in preparation of an ongoing or upcoming pick-and-place job (e.g., replenishment work, kitting work or during loading of a container).

As mentioned above, a container according to one or more example embodiments may be configured to have the same or substantially the same geometry and/or dimensions as a "normal" tray and/or component tape reel, such that the container may be fetched by the actuator/robot.

The container (or the separate storage compartments of the container) may be associated with an identifier or tag (e.g., a barcode and/or radio-frequency identifier (RFID) tag), which in turn may be associated with SMT job related information, location information or other intelligence that may be provided to (and/or known by) a database that updates SMT job related information (related to a pick-and-place job) in a SMT system and/or that is provided to (and/or known by) a separate e-label system. By providing a container with an external geometry of a standard SMD component reel (or a geometry that is similar or substantially similar to the geometry of a component tape reel or a reel+tape guide packet), components delivered in containers other than component tape reels (e.g., plastic bags with components) may be handled and stored in an automatic handling unit such as an automatic SMD warehouse. According to at least some example embodiments, the new containers may be compatible with current SMD warehouses and automated storage solutions. In addition, objects related to SMD processes (e.g., special tools, fixtures, odd shaped components, PCBs, board supports, etc.) may be handled and stored in an automated storage solution, such as an SMD warehouse.

Each container may be provided with one or more storage compartments. Each of the storage compartments may be configured to store one or more plastic bags containing electronic components, so that a plurality of bags with mutually different component types may be stored separately in the same container. The container may also be provided with, or associated with, an electronic label (e-label, such as an electronic shop/shelf label (ESL) as discussed above with regard to FIGS. 8A through 9D, for example) that displays various SMT job. Location information associated with the container (e.g., the ID of the container, the ID of the separate compartments of the container) may be associated with an e-label.

Example embodiments may enable improved material handling solutions relative to the conventional art by providing an automatic solution for handling bags (e.g., plastic bags) including components (e.g., components that are not stored on component tape reels) as well as other objects related to SMD processes and/or pick-and-place jobs/machines, such as special tools, fixtures, odd shaped components, PCBs, board supports, etc.

Example embodiments also provide the ability to handle other objects more easily than component reels related to SMD process in an automatic storage handling unit (e.g., an automatic SMD warehouse). By providing an intelligent box that may be handled in an automatic manner (e.g., an automatic SMD warehouse including an actuator, such as a robot, for handling the containers/boxes), a relatively large variety of components and objects needed in electronic production may be handled. In one or more example embodiments, providing an e-label on, or associated with, the box may enable provisioning of dynamic information to an operator or related machines when handling the container. A display may be attached to, or associated with, the container. The display may display dynamic information based on the current state of the container display information related to the next action for the operator. One or more example embodiments may enable easier handling, for example, components in bags or cut pieces of component tape. One or more example embodiments may also provide the ability to store, and automatically provide, other objects related to production (e.g., fixtures, special tools, the PCBs themselves, tube component adapters, etc.).

The container may be configured to carry, for example, plastic bags with components. In at least one example embodiment, the container may act as a conventional tray box, rather than a 4", 7", 13" or 15" tape reel. In at least this example embodiment, the automated SMD warehouse may handle the container as a tray box.

According to at least one example embodiment, the e-label may be affixed to the sidewalls, base or a portion of the container, other than the lid.

According to at least some example embodiments, all or substantially all of the space that is not seen by the sensors in the automated SMD warehouse may be used.

If the cover is about 8 millimeters (mm) thick, then a container that has a height of about 32 mm with a cover, is only about 24 mm without the cover. Thus, in this example, the container without the cover fits in a 24 mm storage position. Moreover, if the container lid is only about 8 mm thick, then a container that has a height of about 24 mm with a cover and only about 16 mm without a lid. Thus, the container without the cover fits in a 16 mm storage position. Moreover, the vertical height of the container itself may be decreased if a cover is not needed. The display of an e-label may be arranged at an angle such that the display is visible by a user from above and from the side.

The display may be mounted vertically or horizontally on or in a given container.

The container may be configured to be stacked with other containers with or without a lid, and such that the display is visible to a user while the containers are stacked.

According to at least some example embodiments, the e-label may be arranged at the rear of the container, which may reduce the risk of the container tilting forward if heavy objects are placed on the opposite side of the container.

Counter weights may be placed under or on the side of the e-label to balance the container.

Figure 11:
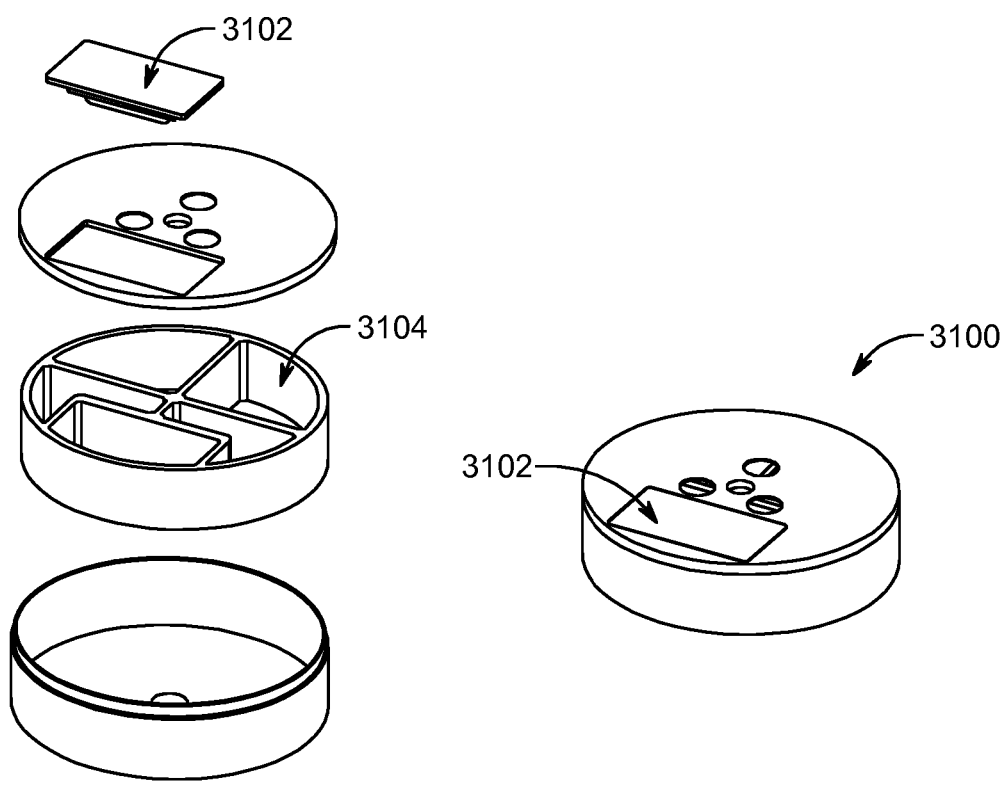
FIG. 11 illustrates a perspective view of an example embodiment of a container simulating a tape reel.

FIG. 11 illustrates a perspective view of an example embodiment of a container simulating a component tape reel having a diameter of about 7", and a height of about 44 mm.

As shown in FIG. 11, the container 3100 may have a label (e.g., an electronic label or tag) 3102 fixed to a surface of the cover of the container 3100. The container 3100 may include one or more compartments 3104 for storing, for example, components (e.g., SMT components).

Figure 12:
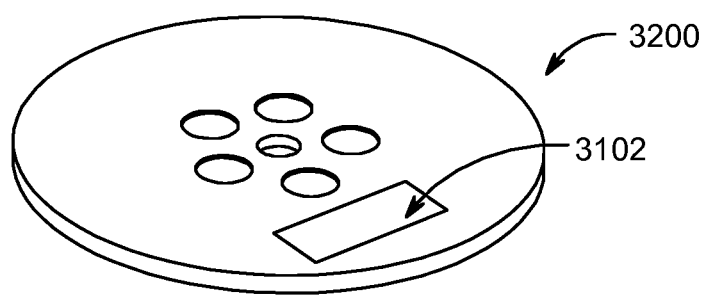
FIG. 12 illustrates a perspective view of another example embodiment of a container simulating a tape reel.

FIG. 12 illustrates a perspective view of another example embodiment of a container simulating a component tape reel having a diameter of about 7", and a height of about 8 mm.

As shown in FIG. 12, the container 3200 may have a label (e.g., an electronic label or tag) 3102 fixed to a surface of the cover of the container 3200. Although not shown, the container 3200 may include one or more compartments for storing, for example, components (e.g., SMT components).

Figure 13:
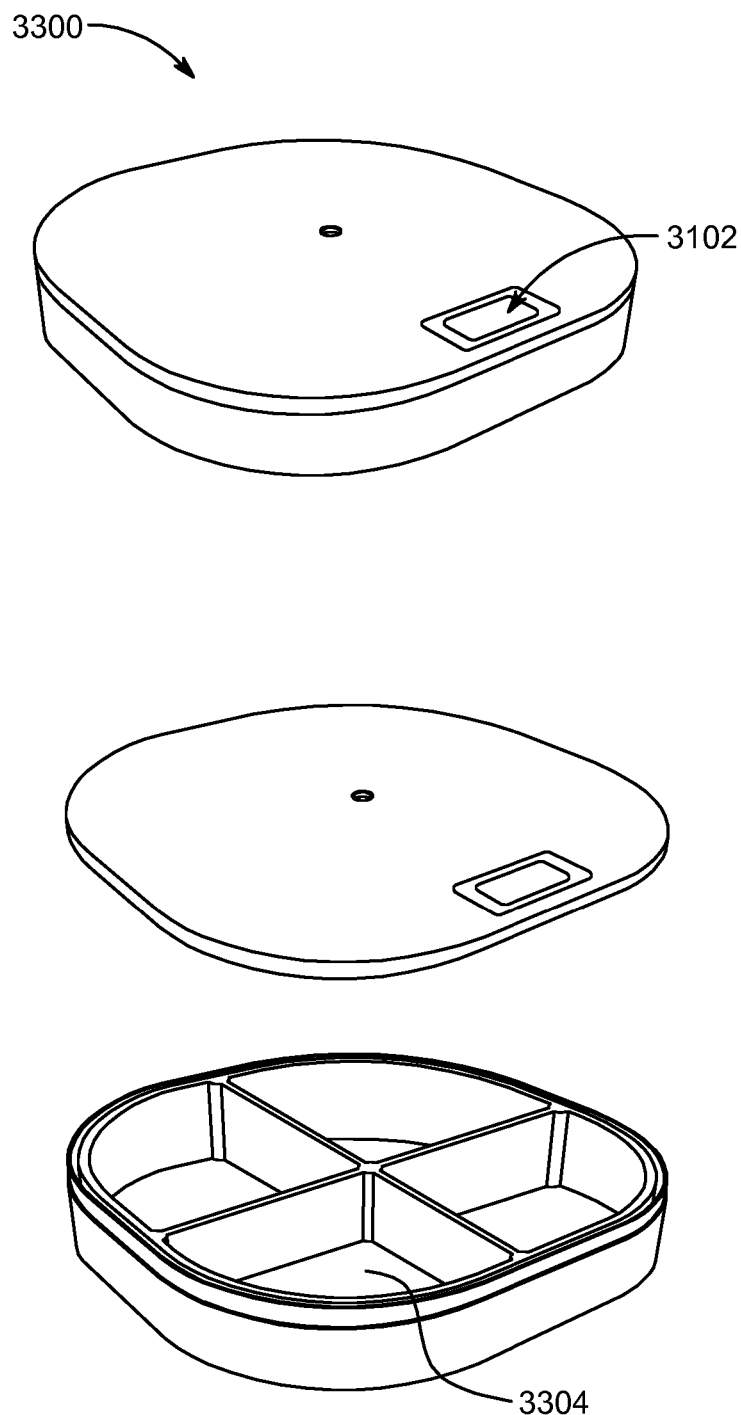
FIG. 13 illustrates a perspective view of another example embodiment of a container simulating a tape reel.
Figure 14:
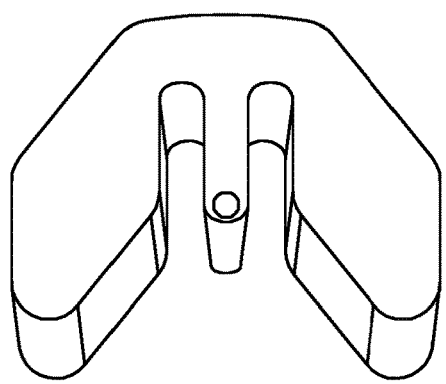
FIG. 14 illustrates a plurality of the example containers shown in FIG. 15 arranged in a vertical stack.

FIG. 13 illustrates a perspective view of an example embodiment of a container simulating a component tape reel having a diameter of about 13", and a height of about 44 mm.

As shown in FIG. 13, the container 3300 may have a label (e.g., an electronic label or tag) 3102 fixed to a surface of the cover of the container 3300. The container 3300 may include one or more compartments 3304 for storing, for example, components (e.g., SMT components).

Figure 15:
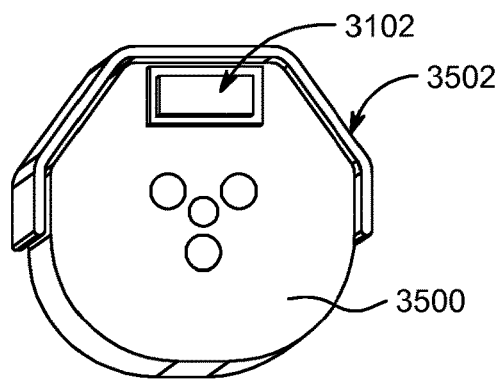
FIG. 15 illustrates an example embodiment of a container.

FIG. 15 illustrates an example embodiment of a container. The container 3500 shown in FIG. 15 may have a diameter of about 7 inches, and a depth of about 16 mm. A label 3102 is fixed to the container 3500. In this example, the container is not round, but has three straight or substantially straight sides at the upper portion in which the label 3102 is fixed.

According to one or more example embodiments, an e-label may be attached to a top cover or any other portion of a container. In at least one example embodiment, the top cover may be removable. In one example, the e-label may be scanned when loading and/or unloading the container.

Figure 17:
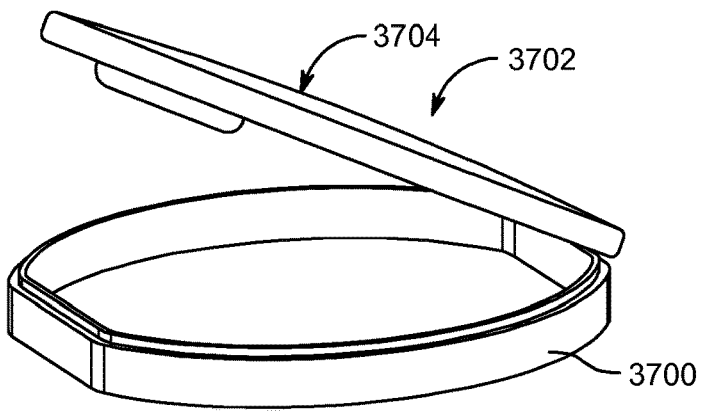
FIG. 17 illustrates an example embodiment of a container having a lid.

FIG. 17 illustrates an example embodiment of a container having a lid. In this example, the lid 3702 is attached to the container 3700 by hinges (not shown) such that the lid may be opened and closed while remaining attached to the container 3700. In at least this example, an e-label 3704 is attached to the underside of the lid 3702 such that the e-label 3704 is visible while the lid 3702 is in the closed position. In another example, the e-label 3704 may be fixed to the underside of the lid 3702.

Figure 16:
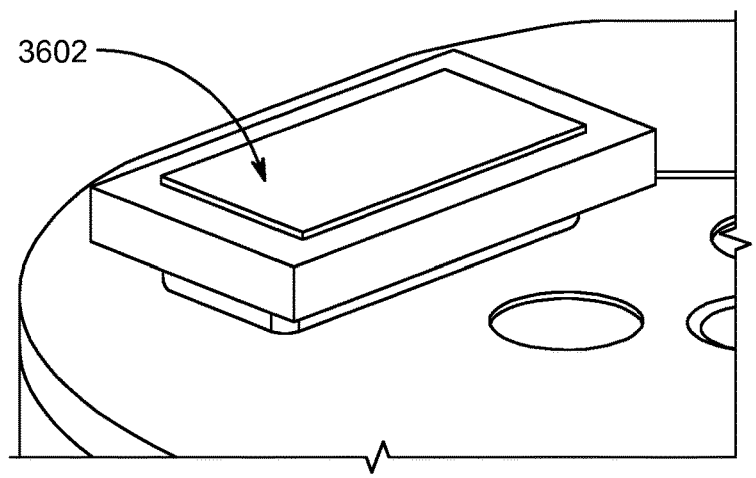
FIG. 16 illustrates an example embodiment in which the e-label is fixed inside a container.

FIG. 16 illustrates an example embodiment in which the e-label 3602 is fixed inside a container. In at least this example embodiment, the e-label 3602 is visible and accessible by a user when the lid of the container (not shown in FIG. 16) is in the open position, or when the lid is removed from the container.

Figure 18:
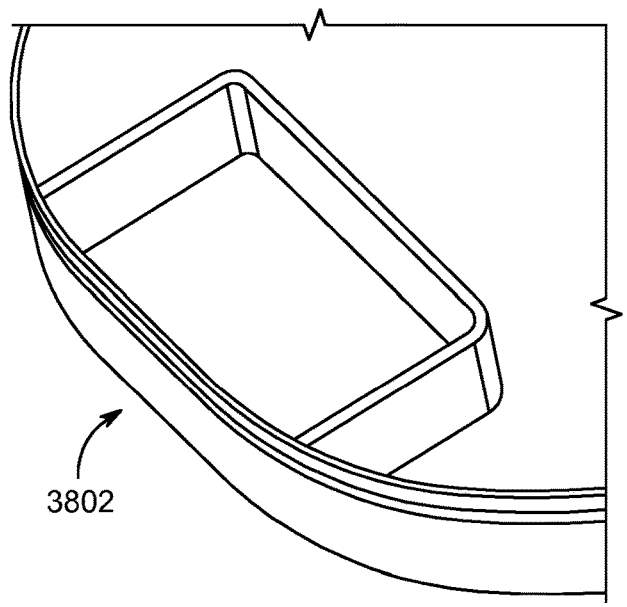
FIG. 18 illustrates an example embodiment of a container including a compartment configured to hold an e-label.

FIG. 18 illustrates an example embodiment of a container including a compartment 3802 configured to hold an e-label (not shown). This additional "box" 3802 within the container may include additional material to hold the e-label in position.

Figure 19:
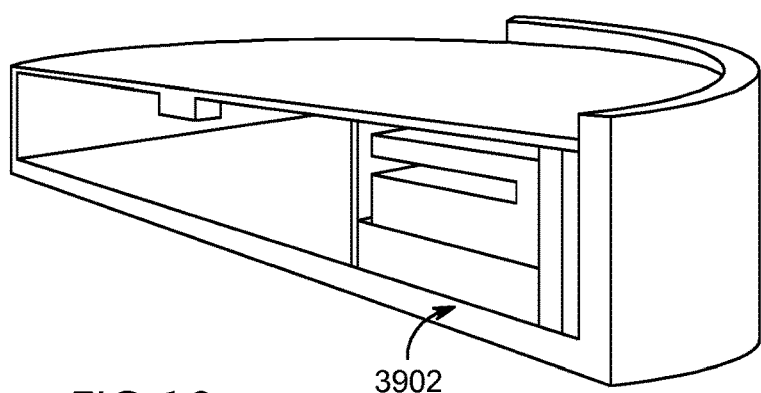
FIG. 19 is a perspective cross-sectional view of an example embodiment of a container.

FIG. 19 is a perspective cross-sectional view of an example embodiment of a container. The container shown in FIG. 19 includes a "box" 3902 within the container to hold an e-label.

According to one or more example embodiments, an e-label may have a display portion with a diagonal of about 2.6", and the e-label may be arranged at an angle of about 60 degrees relative to the base of the container, such that the e-label fits within a container resembling a 24 mm tape (e.g., a total 30.4 mm high).

Figure 20:
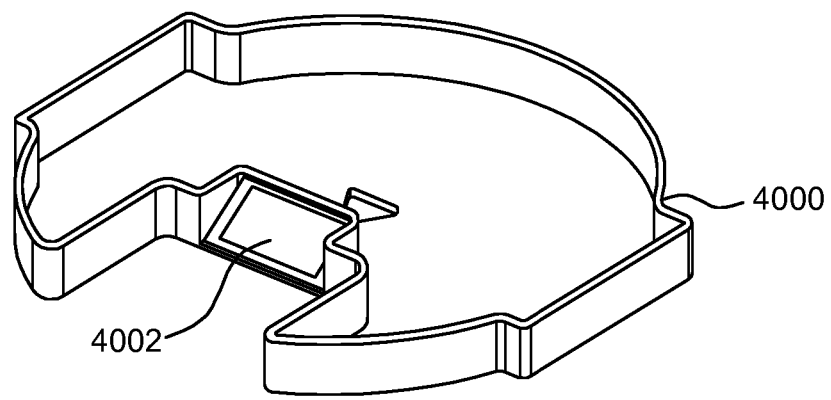
FIG. 20 illustrates an example embodiment of a container or tray box.

FIG. 20 illustrates an example embodiment of a container or tray box 4000. As shown in FIG. 20, an e-label 4002 is fixed to the tray box 4000 at an angle. In one example, the e-label 4002 may be fixed to the tray box at an angle of about 60 degrees.

According to at least some example embodiments, the e-label 4002 may be readable both from the front and for the barcode reader in the automated SMD warehouse (e.g., including an actuator/robot).

Figure 21:
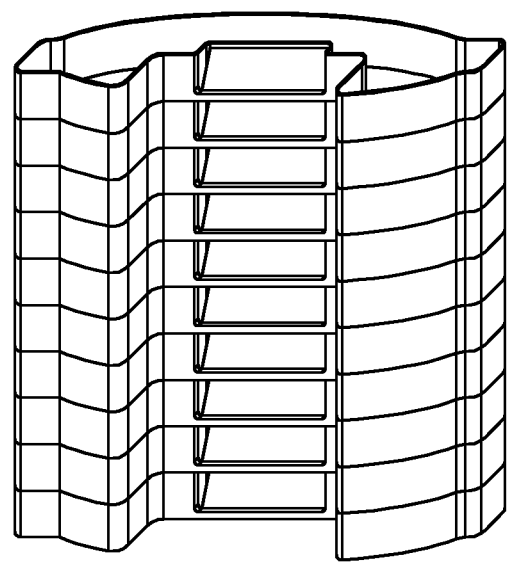
FIGS. 21 and 22 illustrate example embodiments of a plurality of containers or tray boxes arranged in a vertical stack.
Figure 22:
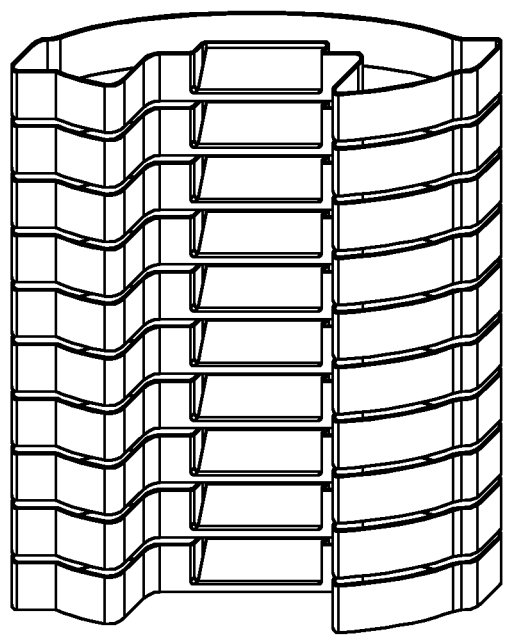

FIGS. 21 and 22 illustrate example embodiments of a plurality of containers or tray boxes arranged in vertical stacks. As shown in FIGS. 21 and 22, the displays of the e-labels for each of the tray boxes is visible even when the containers are stacked on one another. For an 8 mm container, for example, a cover may be added to improve readability.

Figure 23:
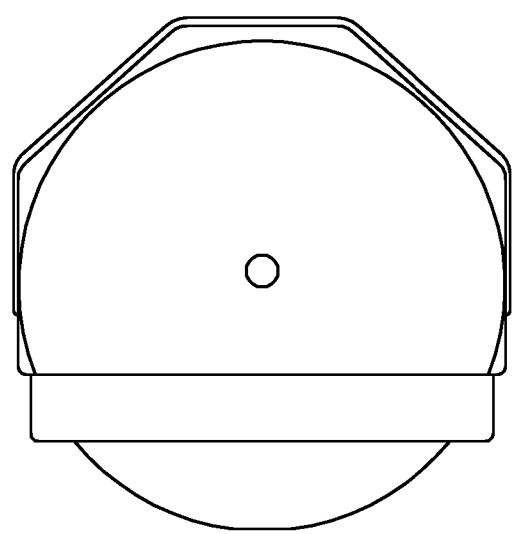
FIGS. 23 through 25 illustrate containers or tray boxes configured to resemble component tape reels, according to example embodiments.
Figure 24:
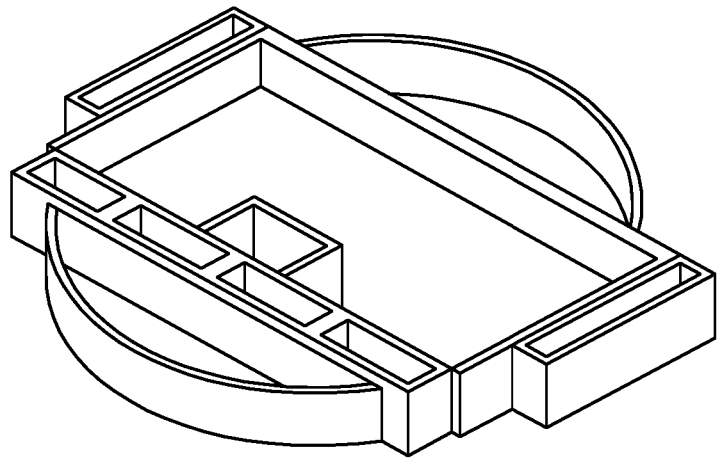
Figure 25:
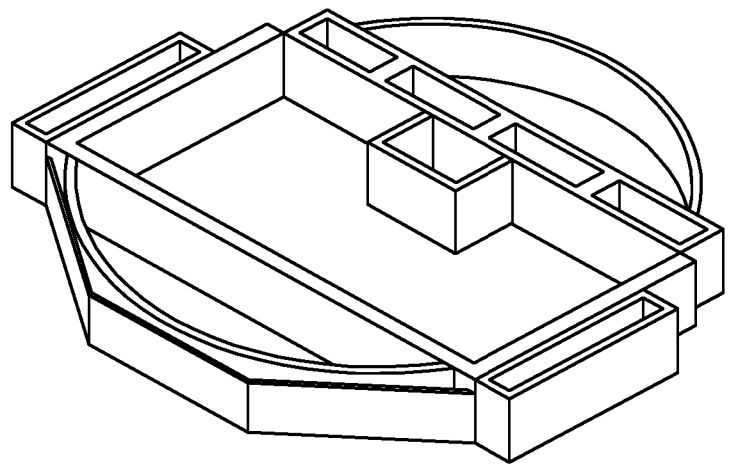

FIGS. 23 through 25 illustrate containers or tray boxes configured to resemble component tape reels, according to example embodiments. In more detail, FIG. 23 is a plan view of a bottom of a container or tray box, according to an example embodiment; FIG. 24 is a first perspective view of a top side of the container or tray box shown in FIG. 23; and FIG. 25 is a second perspective view of a top side of the container or tray box shown in FIG. 23.

According to at least some example embodiments, containers or tray boxes may be shaped and configured as conventional component tape reels. In at least some example embodiments, the containers or tray boxes may have diameters of 7" or 13", may have depths between about 8 mm and about 56 mm, inclusive, and may use all or substantially all (e.g., about 100%) of the available volume for storage.

According to at least some example embodiments, the containers may be compatible with devices for handling component tape reels, including conventional SMD towers or warehouses.

One or more example embodiments also provide a container configured to function as a tray box. According to at least some example embodiments, the container may occupy a 13" position, and may support multiple carriers.

Figure 26:
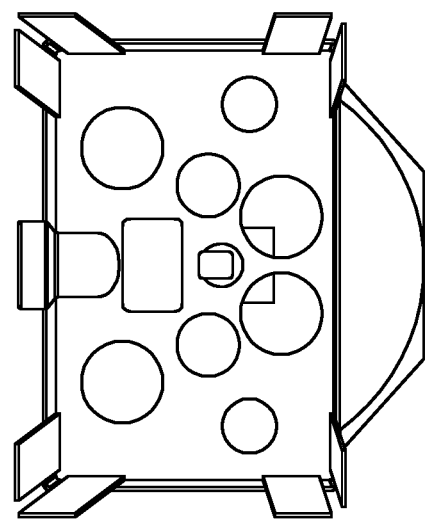
FIG. 26 illustrates an example of a "super-sized" tray box, according to an example embodiment.
Figure 27:
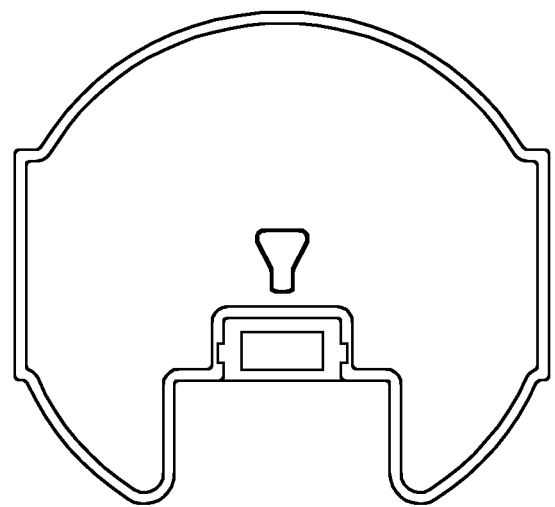
FIGS. 27 through 33 illustrate example embodiments of containers or tray boxes.
Figure 28:
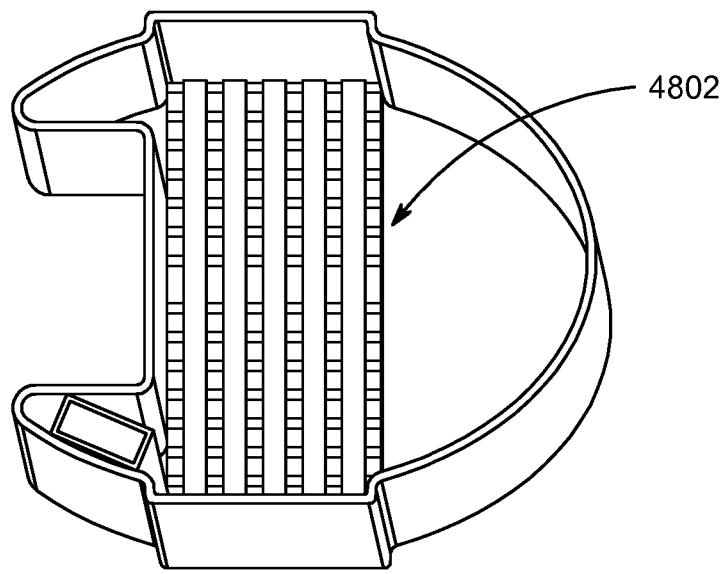
Figure 29:
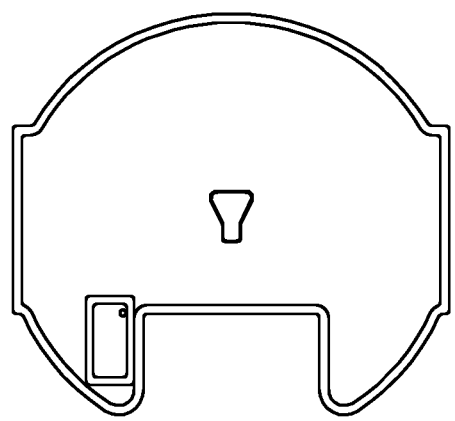
Figure 30:
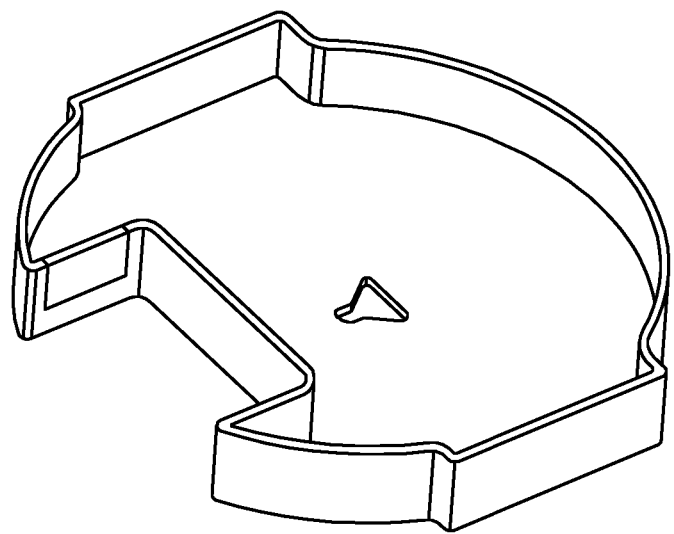
Figure 31:
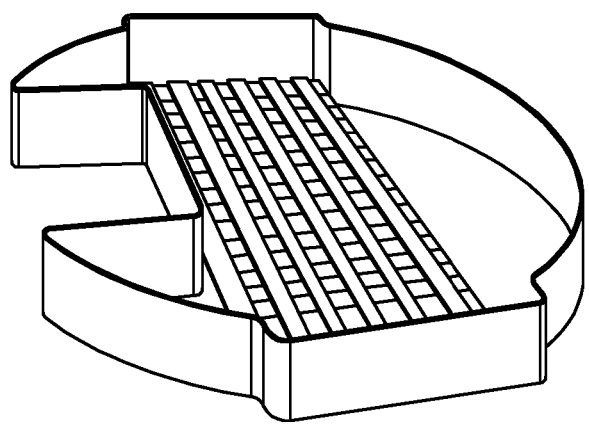
Figure 32:
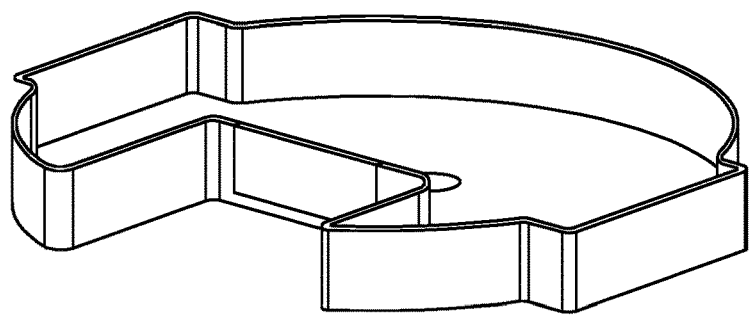
Figure 33:
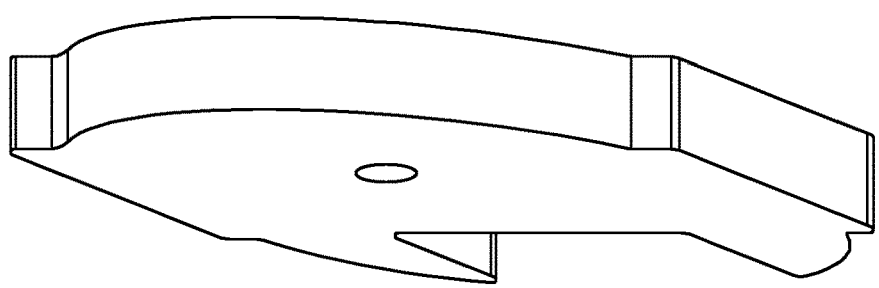

One or more example embodiments may provide a "super-sized" tray box, an example of which is shown in FIG. 26. Configuring a container as a super-sized tray box may enable reuse of space that is not accessible and/or visible to conventional automated SMD warehouse sensors.

FIGS. 27 through 33, 36 and 37 illustrate example embodiments of tray boxes in which an e-label is arranged at varying positions on the tray boxes.

In one example, the e-label may be placed on the outside to increase storage space within the container.

By tilting the e-label, a JEDEC tray may fit in the container.

A static label may also be placed on the cover tray box, for example, when the e-label is arranged off center.

If the tray box cover is about 8 mm thick, then the tray box may be inserted/stored without the cover and use less space in a SMD tower. Moreover, time required to access the content of the tray box may be decreased. Additionally, the container or tray box may include a recessed portion at the rear, wherein the recessed portion may be configured such that a gripper arm may grab and lift the container or tray box similar to a conventional tray.

Figure 34:
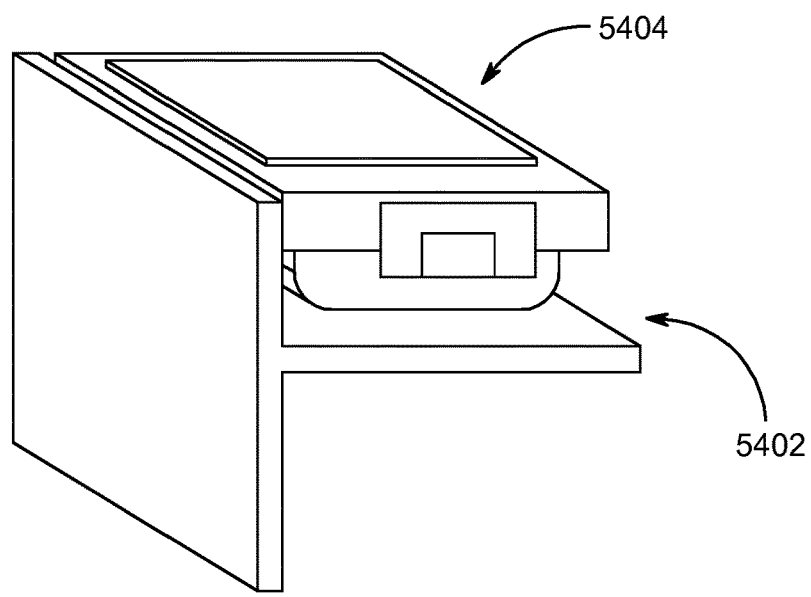
FIGS. 34 and 35 illustrate an example embodiment of an e-label arranged on a 90 degree support structure.
Figure 35:
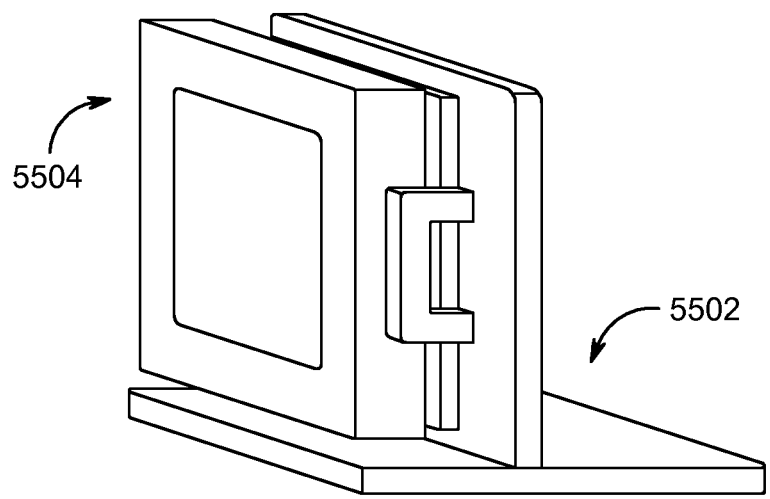
Figure 36:
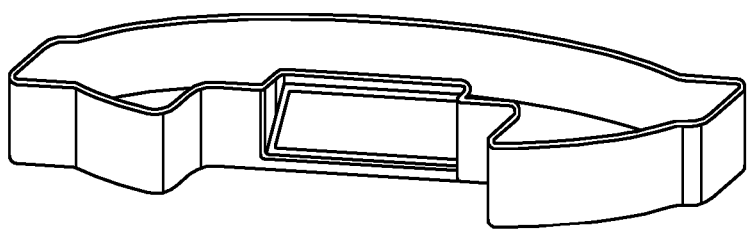
FIGS. 36 and 37 illustrate example embodiments of containers or tray boxes.
Figure 37:
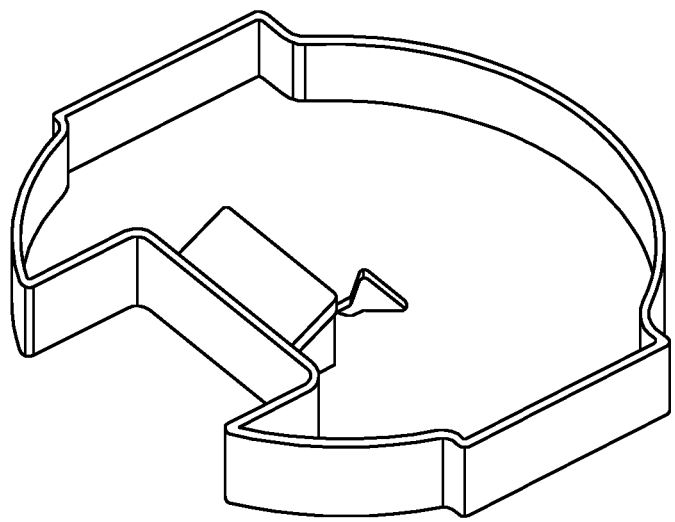

FIGS. 34 and 35 illustrate an e-label arranged on a 90 degree support structure.

In more detail, FIG. 34 illustrates an e-label 5404 arranged horizontally on a 90-degree support structure 5402, according to an example embodiment.

FIG. 35 illustrates an e-label 5504 arranged vertically on a 90-degree support structure 5502, according to an example embodiment.

The holder may enable the container or tray box to be used as a storage for smaller items on a normal shelf (e.g., outside the tower or with newer towers) stacking them on each other in a pile. The support structures may be fixed to containers and/or tray boxes discussed herein.

According to at least some other example embodiments, e-labels may be placed in 45 degrees, and be visible from both the top and the side of the containers or tray boxes.

At least some example embodiments provide a tray box (or container) with an external geometry of a standard SMD component reel. Boxes with this external geometry enable storing of components delivered in containers other than standard SMD component reels (e.g., bags with components) in a SMD tower (e.g., a conventional SMD tower) with little or no modification to the SMD tower itself. Boxes with such external geometry also enable automatic storing and handling of other objects related to SMD processes, such as special tools, fixtures, odd shaped components, PCBs, board supports, etc. As discussed herein, the tray boxes may also be referred to as boxes or containers.

As discussed herein, boxes according to at least some example embodiments may include e-labels for displaying various information in the different phases of the container and/or usage of the container. The e-labels may be permanently, temporarily, or removably fixed to the container or a cover of the container.

Conventional SMD towers with STSys 1.3 can support containers or tray boxes of three sizes: Tray Box 16, Tray Box 32 and Tray Box 44. A box is detected by a SMD tower with a line of 3 diameter sensors in the front of the terminal "floor". In one example, if the 3 diameter sensors detect a straight line, then the SMD tower determines that the container is a tray box. If the two outermost sensors detect an object just prior to the middle sensor when the object is moved into the SMD tower, then the SMD tower determines that the box is a conventional SMD component reel (e.g., a round object).

Figure 38:
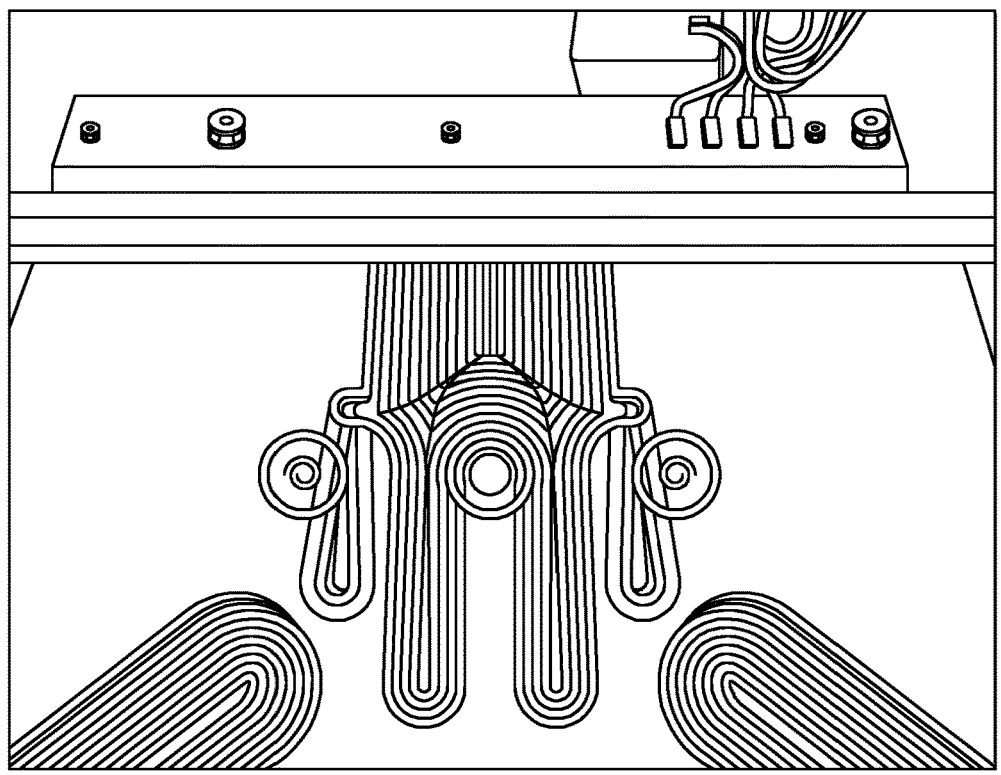
FIG. 38 illustrates a line of three diameter sensors for detecting containers in the front of the terminal floor.

FIG. 38 illustrates a line of three diameter sensors for detecting containers in the front of the terminal floor of an SMD tower. In FIG. 38, the sensors are identified by white circles.

According to at least some example embodiments, firmware of a SMD tower may be adapted to accept a straight line further from the center than a distance associated with conventional tray boxes.

Figure 39:
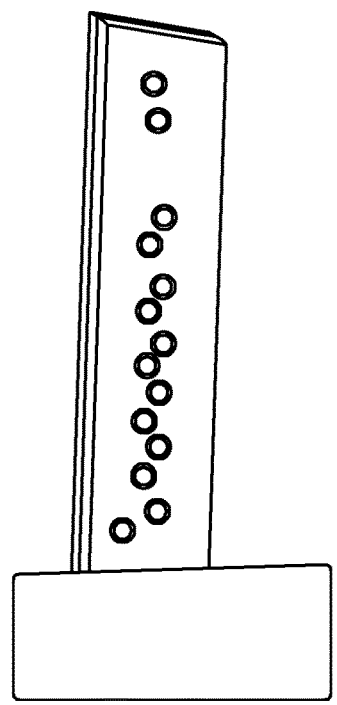
FIG. 39 illustrates an example embodiment of a height sensor.

A SMD tower may also measure the height of a container moved into the SMD tower. In one example, the height of a container is measured by sensors on the side of the "walls" of a SMD tower. Conventional tray boxes, such as Tray Box 16, Tray Box 32 and Tray Box 44 have actual heights of about 26 mm, 42 mm and 60 mm, respectively. FIG. 39 illustrates an example height sensor.

In order for first generation containers to be compatible with conventional SMD towers with STSys, only the three existing size containers or tray boxes (e.g., Tray Box 16, Tray Box 32 and Tray Box 44) adapted for 13" magazines may be used in a SMD tower. Since there are a relatively limited number of 44 mm high 13" space magazines in standard SMD towers with standard configuration, a compromise for storage capability may be achieved by using the 32 mm high 13" magazines. A 16 mm high 13" magazine may also be used, but provides less storage space.

Example embodiments may be adapted to show (e.g., using an e-label or other display) content, including what to provide and/or collect from a container. Example embodiments may also utilize provide/idle states for the containers.

SMD tower firmware, according to at least some example embodiments, may be adapted for larger containers or tray boxes, and may have improved support for multiple objects in containers or tray boxes.

According to at least some example embodiments, geometry of the current containers or tray boxes may be used as a guide. Containers or tray boxes, according to at least some example embodiments, may be as large (e.g., have diameters of 13") and as high (e.g., for 32 mm Tray Box 32 the height limit is about 42 mm) as possible.

Figure 40:
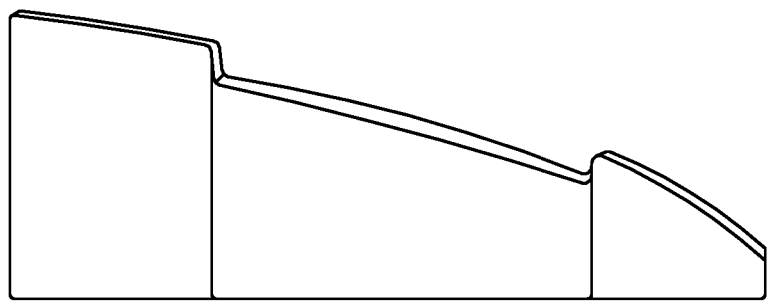
FIG. 40 illustrates a perspective side view of an example embodiment of a container.

FIG. 40 illustrates a perspective side view of an example embodiment of a container.

Figure 41:
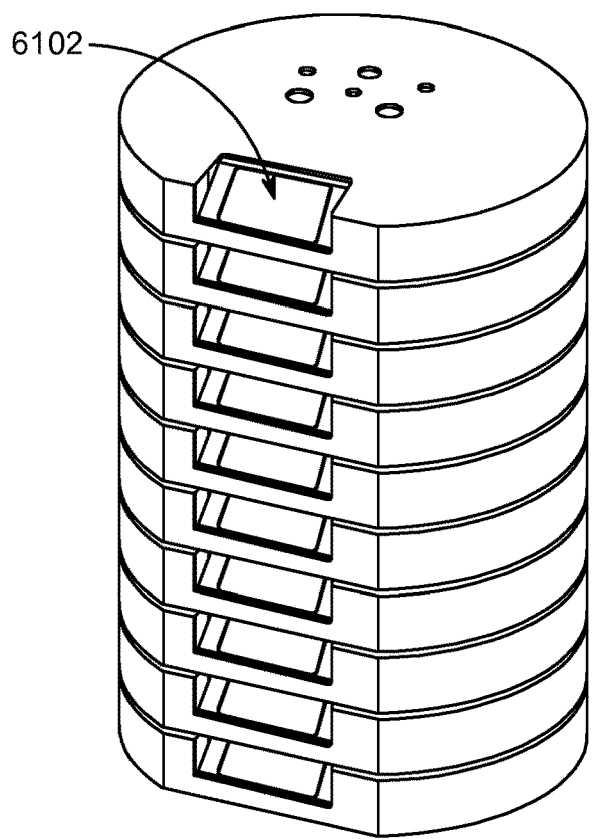
FIG. 41 illustrates another example embodiment of a plurality of containers or tray boxes arranged in a vertical stack.

FIG. 41 illustrates an example embodiment of a plurality of containers arranged in a vertical stack. As shown in FIG. 41, the displays 6102 of the e-labels for each of the containers are visible even when the containers are stacked vertically on one another.

Figure 42:
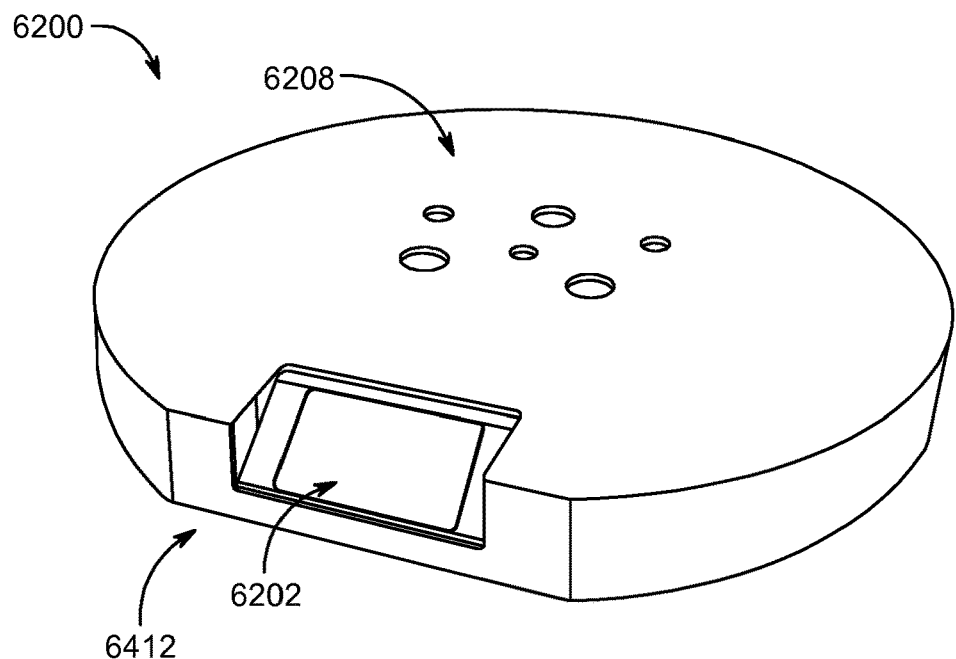
FIGS. 42 through 44 illustrate example embodiments of a container or tray box.
Figure 43:
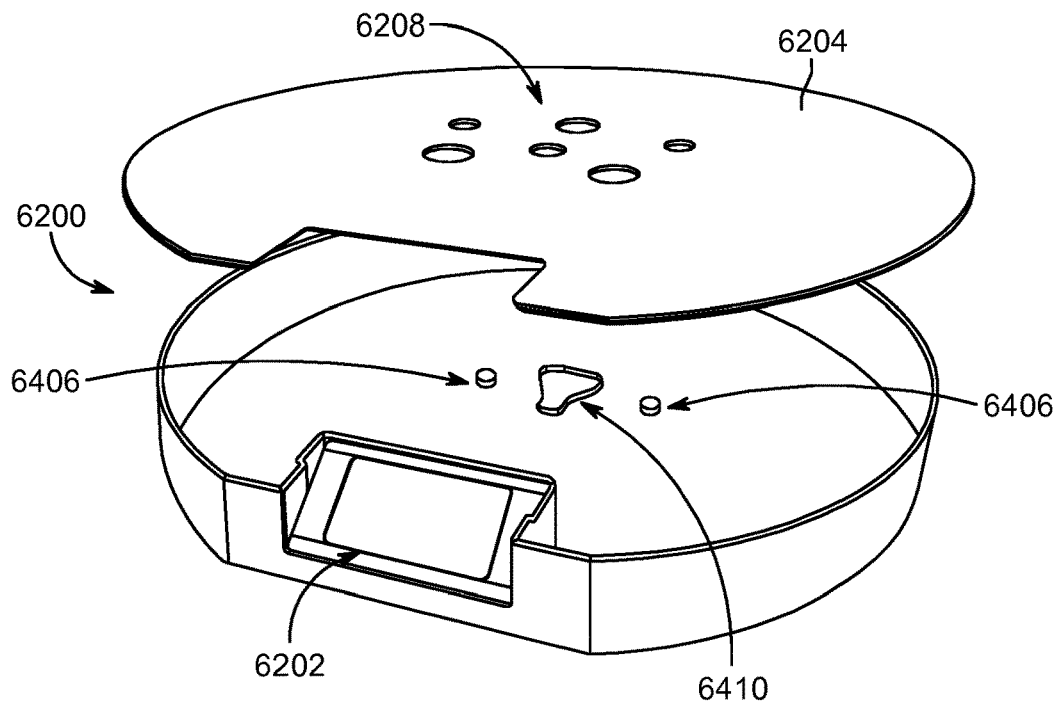
Figure 44:
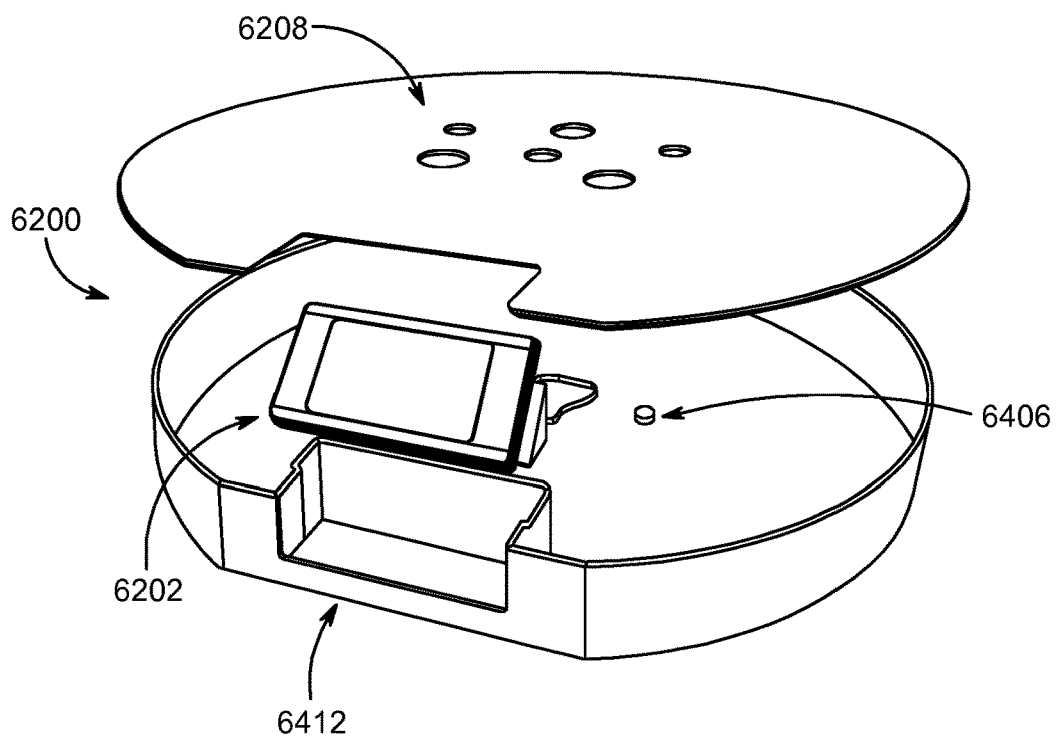

FIGS. 42-44 illustrate various views of containers according to example embodiments.

Referring to FIGS. 42-44, the container 6200 may have a removable cover 6204 and orientation pins 6406. In the example shown in FIGS. 42-44, the container 6200 has two orientation pins 6406 at the base of the container.

The container 6200 also includes a hole pattern 6410 at the base (or bottom) of the container (e.g., between the orientation pins 6406). The hole pattern 6410 may be used to align the container by centering a pin in the bottom of the container.

Containers according to at least some example embodiments may be utilized without a cover. Each sensor may have the same visible height and/or the containers may have a groove at the rear of the container configured to receive a gripper arm (e.g., of an actuator in a SMD Tower) to move the container.

Containers according to at least some example embodiments may be separated into sections using, for example, inserts. Inserts may be customized (e.g., ESD foam with the same or substantially the same geometry as the container where the user may cut out portions as desired).

Still referring to FIGS. 42-44, the container 6200 may have a straight portion 6412, which is greater than or equal to about 120 mm in length, at the front portion of the container to show a straight line for the three diameter sensors discussed above with regard to FIG. 38.

An e-label 6202 may be mounted on the container 6200 itself (rather than on the cover). The e-label 6202 may be visible and readable to a barcode reader (not shown) of the SMD Tower and/or visible and readable from the front portion of the container. The e-label 6202 may be removable, interchangeable, and may have a replaceable battery. The e-label 6202 may be fixed to the container 6200 at an angle. The e-label 6202 may be any suitable e-label, including e-labels according to example embodiments discussed herein.

According to at least some example embodiments, the container 6200 may be configured to hold e-labels of various sizes including, for example, e-labels of about 2.0", about 2.2" and/or about 2.6".

Containers according to at least some example embodiments may have a block with a static barcode. The entire e-label front may be a module on the container, and another module may serve as the static barcode.

As mentioned above, the container 6200 may further include a cover 6204. The cover 6204 may be relatively easily removable. The cover 6204 may have holes 6208. A portion of the holes 6208 may include one or more 13 mm holes configured to receive a gripper arm (e.g., of an actuator of a SMD Tower) on the top cover 6204. Others of the holes 6208 may be other gripping holes in the cover 6204. Still others of the holes 6208 may be configured to receive the orientation pins 6406 at the base of other containers when stacked vertically as shown, for example, in FIG. 41.

Walls of the container 6200 may have gripping points, and the inside and/or the outside of the base of the container 6200 may be composed of friction material to reduce movement of the box and/or objects within the container (e.g., when an actuator of the SMD Tower is moving). In at least one example embodiment, the container 6200 may be made of an ESD safe material.

The foregoing description of example embodiments has been provided for purposes of illustration and description. It is not intended to be exhaustive or to limit the disclosure. Individual elements or features of a particular embodiment are generally not limited to that particular example embodiment, but, where applicable, are interchangeable and can be used in a selected example embodiment, even if not specifically shown or described. The same may also be varied in many ways. Such variations are not to be regarded as a departure from the disclosure, and all such modifications are intended to be included within the scope of the disclosure.

What is claimed is:

1. A container for use in a Surface Mount Technology (SMT) system comprising a Surface Mount Device (SMD) warehouse, the container comprising:
   an outer shell having side walls and a base defining at least one compartment to accommodate an SMT-job related object;
   a cover configured to at least partly enclose the at least one compartment; and
   a display unit configured to display information related to the SMT-job related object;
   wherein the container has an outer shape allowing the container to be transported by an actuator of the SMD warehouse,
   wherein the display unit is an electronic alphanumerical display that is configured to display information including at least one of
   alphanumeric information, or
   an optically scannable code.

2. The container according to claim 1, wherein the outer shell has a shape conforming to a shape of a component tape reel.

3. The container according to claim 1, wherein the at least one compartment is a plurality of compartments to accommodate a plurality of SMT-job related objects.

4. The container according to claim 1, wherein the cover is a removable lid for retaining the SMT-job related object in the at least one compartment.

5. The container according to claim 1, comprising an identity tag storing a unique identity of the container in the SMT system.

6. The container according to claim 5, wherein the unique identity is associated with the SMT-job related object.

7. The container according to claim 5, wherein the identity tag comprises a barcode or RFID tag.

8. The container according to claim 1, wherein the display unit is further configured to display SMT-job related information retrieved from an SMT database of the SMT system.

9. The container according to claim 1, wherein the display unit is further configured to display information associated with a unique identity of the container in the SMT system.

10. The container according to claim 1, further comprising an input device.

11. The container according to claim 10, wherein said input device is operably connected to the display unit so as to trigger a change of information displayed on the display unit.

12. The container according to claim 1, wherein the compartment has a shape allowing the compartment to store at least one of the following SMT-job related objects:
    components in plastic bags;
    components without a component reel;
    components on a component reel with an attached feeder;
    tools;
    fixtures;
    JEDEC trays;
    printed circuit boards; and
    board supports.

13. A Surface Mount Technology (SMT) system, comprising:
    at least one container, the at least one container including
       an outer shell having side walls and a base defining at least one compartment to accommodate an SMT-job related object,
       a cover configured to at least partly enclose the at least one compartment, and
       a display unit configured to display information related to the SMT-job related object;
    a Surface Mount Device (SMD) warehouse;
    an SMT database; and
    a controller,
    wherein the at least one container has an outer shape allowing the at least one container to be transported by an actuator of the SMD warehouse,
    wherein the SMT database is configured to store an identity of the SMT-job related object, an identity of the at least one container, and a storage location of the at least one container within the SMD warehouse.

14. The SMT system according to claim 13, wherein the controller is configured to transmit input data to the at least one container, and wherein the display unit is configured to receive the input data and display information related to said input data.

15. The SMT system according to claim 14, wherein said input data comprises information associated with an ongoing and/or an upcoming SMT job.

16. The SMT system according to claim 13, further comprising a wireless communication network configured to send information between the SMT database and at least one of the container, the controller and the SMD warehouse.

17. The SMT system according to claim 15, wherein the controller is configured to transmit said input data upon request by an operator.

18. The SMT system according to claim 14, wherein said input data are associated with a certain changeover process, replenishment work or kitting work.

19. The SMT system according to claim 13, wherein the at least one container is a plurality of stackable containers.

20. The SMT system according to claim 19, wherein each stackable container of the plurality of stackable containers comprises at least one orientation pin and a at least one recess, and wherein the orientation pin of a first stackable container of the plurality of stackable containers is configured to engage with the recess of a second one of the plurality of stackable containers when stacked.

\* \* \* \* \*